US012811505B2

(12) United States Patent
Hoang

(10) Patent No.: US 12,811,505 B2
(45) Date of Patent: Nov. 24, 2026

(54) SWITCHING DEVICE AND POWER SUPPLY DEVICE

(71) Applicant: ROHM CO., LTD., Kyoto (JP)

(72) Inventor: Tan Nhat Hoang, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 97 days.

(21) Appl. No.: 18/786,092

(22) Filed: Jul. 26, 2024

(65) Prior Publication Data

US 2024/0388209 A1 Nov. 21, 2024

Related U.S. Application Data

(63) Continuation of application No. PCT/JP2022/040106, filed on Oct. 27, 2022.

(30) Foreign Application Priority Data

Feb. 3, 2022 (JP) ................................ 2022-015660

(51) Int. Cl.
*H02M 3/335* (2006.01)
*H02M 3/00* (2006.01)
(Continued)

(52) U.S. Cl.
CPC ....... *H02M 3/33573* (2021.05); *H02M 3/003* (2021.05); *H10W 70/658* (2026.01); *H10W 90/00* (2026.01)

(58) Field of Classification Search
CPC . H02M 3/003; H02M 3/33573; H10W 90/00; H01W 70/658
See application file for complete search history.

(56) References Cited

U.S. PATENT DOCUMENTS 6,172,884 B1 * 1/2001 Lanni .................. H02M 1/4258 363/21.05
6,483,724 B1 * 11/2002 Blair ....................... H02M 1/44 363/17
(Continued)

FOREIGN PATENT DOCUMENTS

JP 2004-056971 2/2004
JP 2015-201947 11/2015
(Continued)

OTHER PUBLICATIONS

International Search Report and Written Opinion in International Appln. No. PCT/JP2022/040106, mailed on Jan. 17, 2023, 17 pages (with machine translation).
(Continued)

*Primary Examiner* — Gary L Laxton
(74) *Attorney, Agent, or Firm* — Fish & Richardson P.C.

(57) ABSTRACT

A switching device includes: a reference terminal; a supply terminal fed with a supply voltage; a first transistor configured to be inserted between the supply terminal and the first terminal of the primary winding of a transformer; a second transistor configured to be inserted between the reference terminal and the first terminal of the primary winding; a third transistor configured to be inserted between the supply terminal and the second terminal of the primary winding; a fourth transistor configured to be inserted between the reference terminal and the second terminal of the primary winding; a first diode configured to be connected in parallel with the first transistor; and a second diode configured to be connected in parallel with the second transistor. The first and second diodes have their forward direction pointing from the reference terminal to the supply terminal.

12 Claims, 23 Drawing Sheets

(51) Int. Cl.

| | |
|---|---|
| ***H10W 70/65*** | (2026.01) |
| ***H10W 90/00*** | (2026.01) |

(56) References Cited

U.S. PATENT DOCUMENTS

| | | | | |
|---|---|---|---|---|
| 6,992,902 | B2 * | 1/2006 | Jang | H02M 3/33573 363/17 |
| 7,313,003 | B2 * | 12/2007 | Nakahori | H02M 1/34 363/56.02 |
| 7,831,401 | B2 * | 11/2010 | Jungreis | H02M 3/01 363/16 |
| 8,035,996 | B1 * | 10/2011 | Greenfeld | H02M 3/3376 363/17 |
| 8,564,984 | B2 * | 10/2013 | Mao | H02M 3/28 363/56.02 |
| 2016/0111964 | A1 | 4/2016 | Oki et al. | |
| 2017/0310207 | A1 * | 10/2017 | Azotea | H02M 1/34 |
| 2018/0190624 | A1 | 7/2018 | Okumura | |

FOREIGN PATENT DOCUMENTS

| | | |
|---|---|---|
| JP | 2016-208725 | 12/2016 |
| JP | 2020-022299 A | 2/2020 |
| JP | 2021-089991 | 6/2021 |
| JP | 2021-168534 A | 10/2021 |

OTHER PUBLICATIONS

JP OA—Japanese Patent Office, Office Action in Japanese Appln. No. 2023-578375, dated Aug. 4, 2026, 7 pages (with English Translation).

Office Action in German Appln. No. 112022005749.1, mailed on Aug. 25, 2026, 7 pages (with English translation).

* cited by examiner

FIG.6
[MD3]
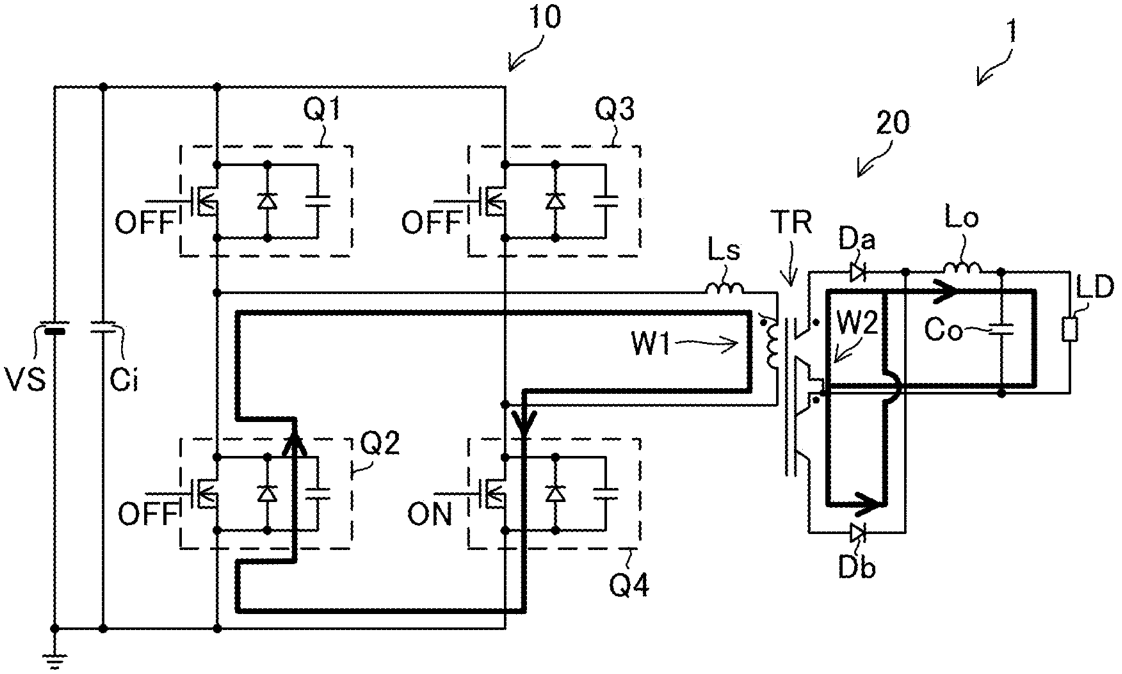
[MD4]
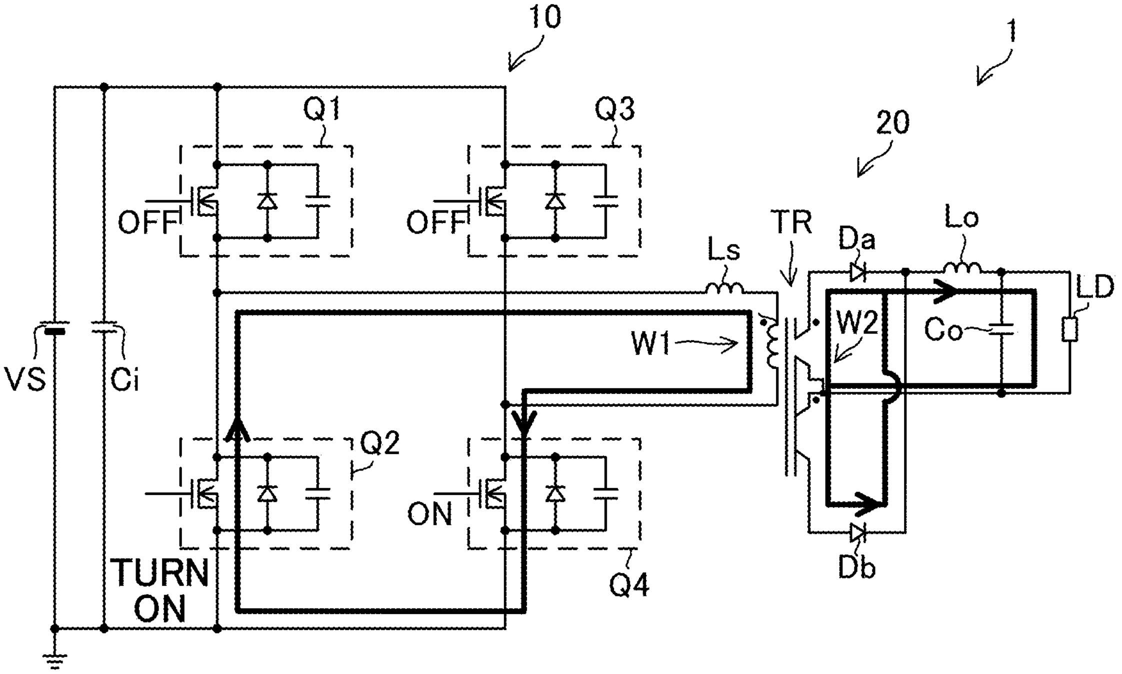

FIG.7
[MD5]
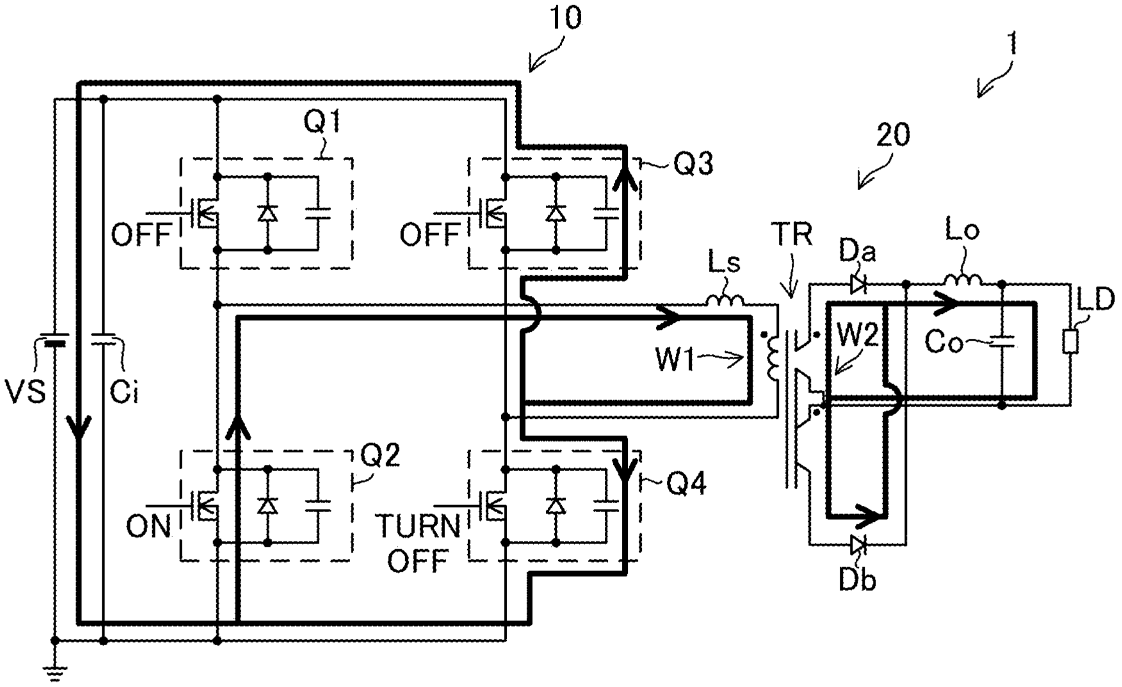
[MD6]
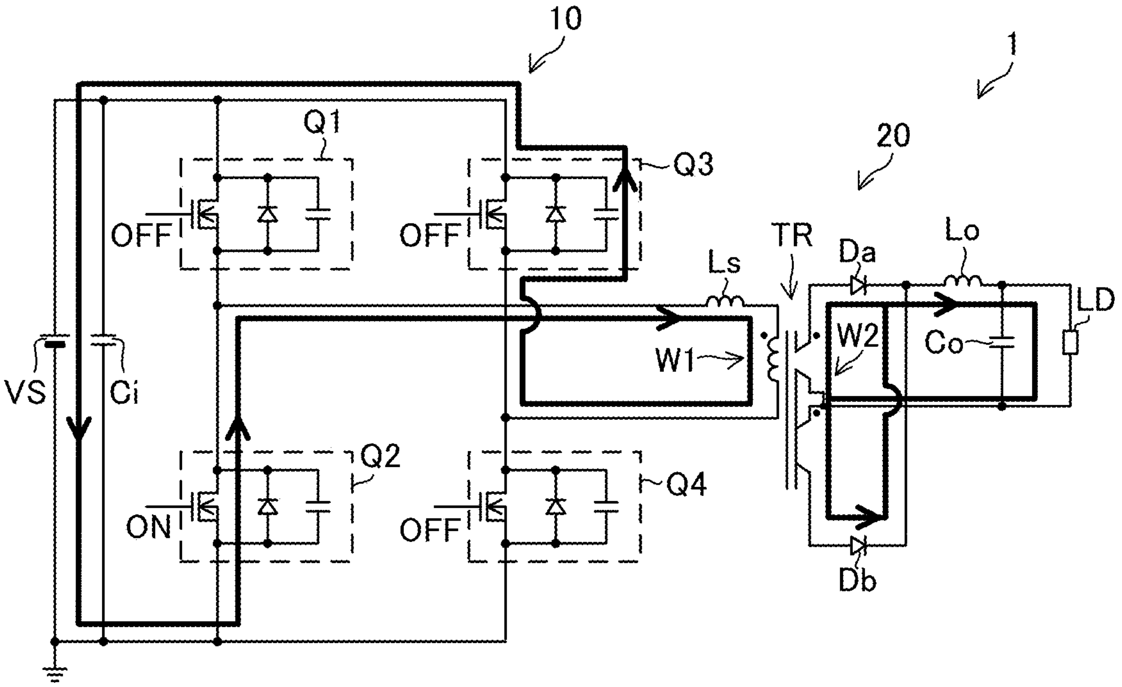

FIG.8
[MD7]
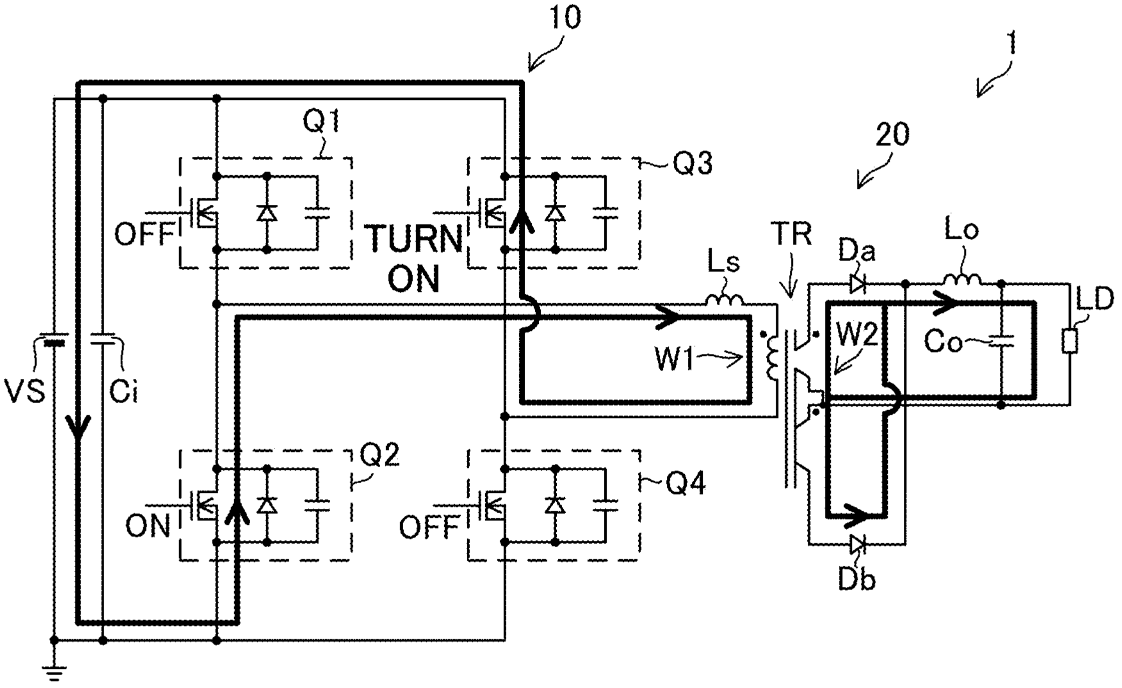
[MD8]
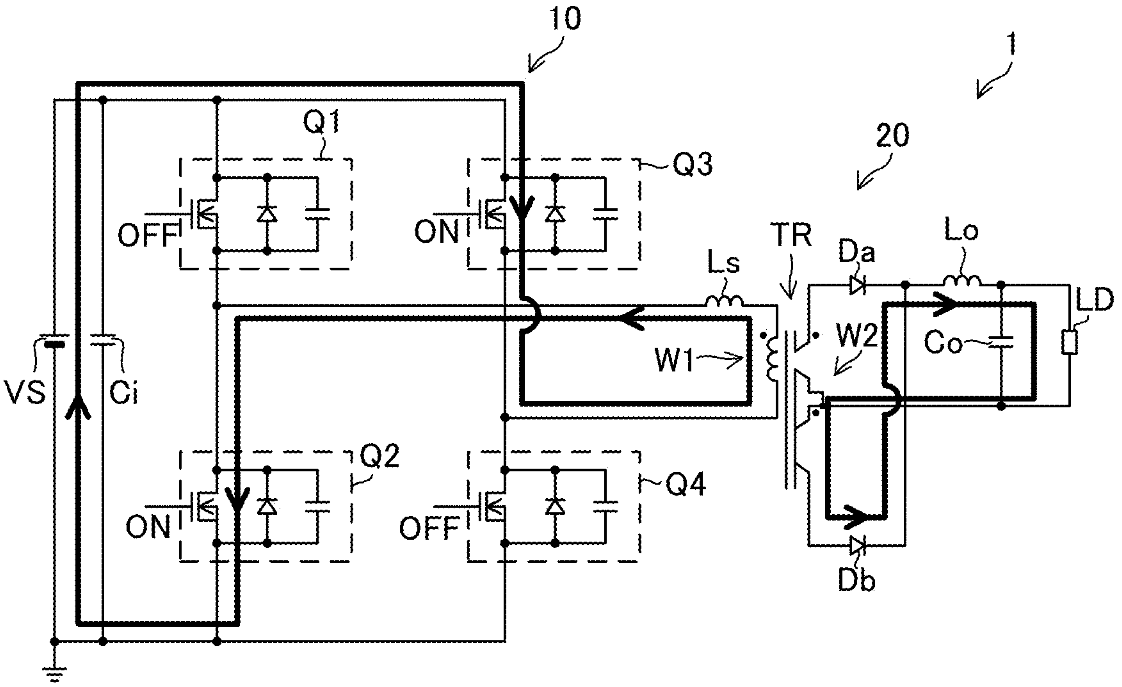

FIG.9
[MD9]
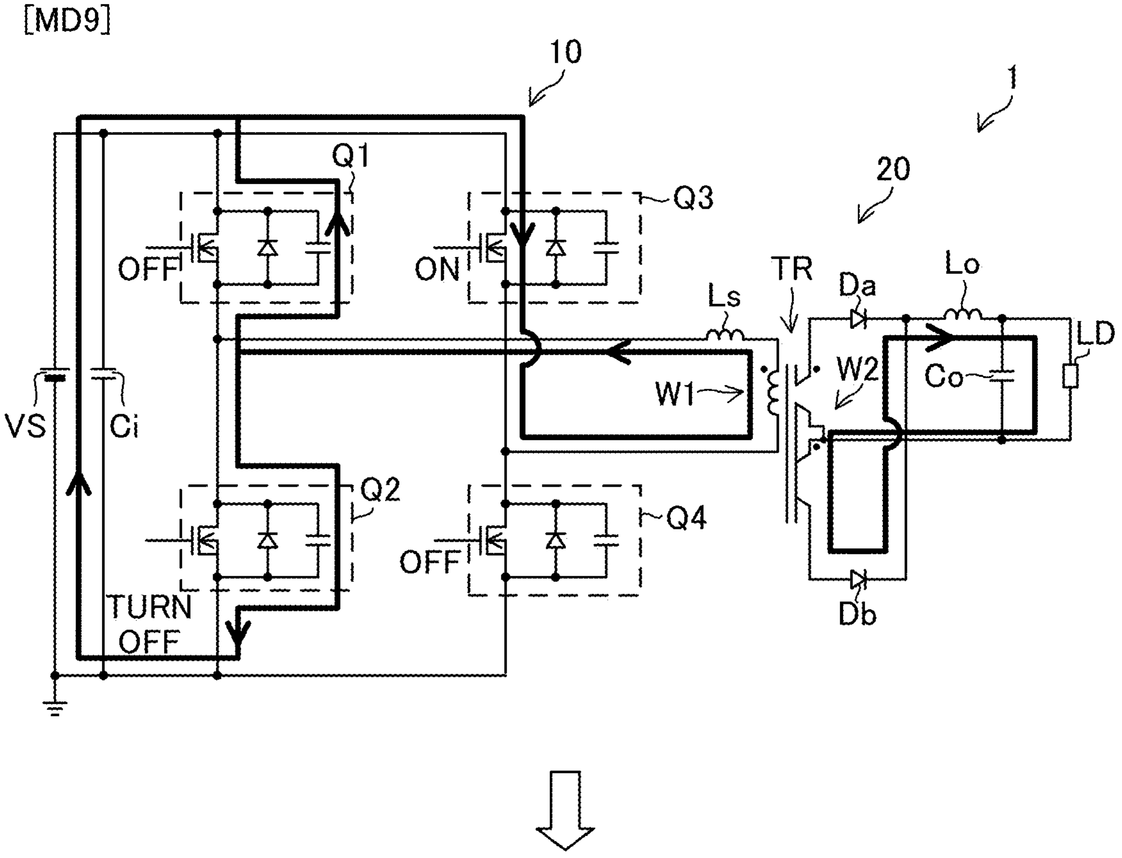
[MD10]
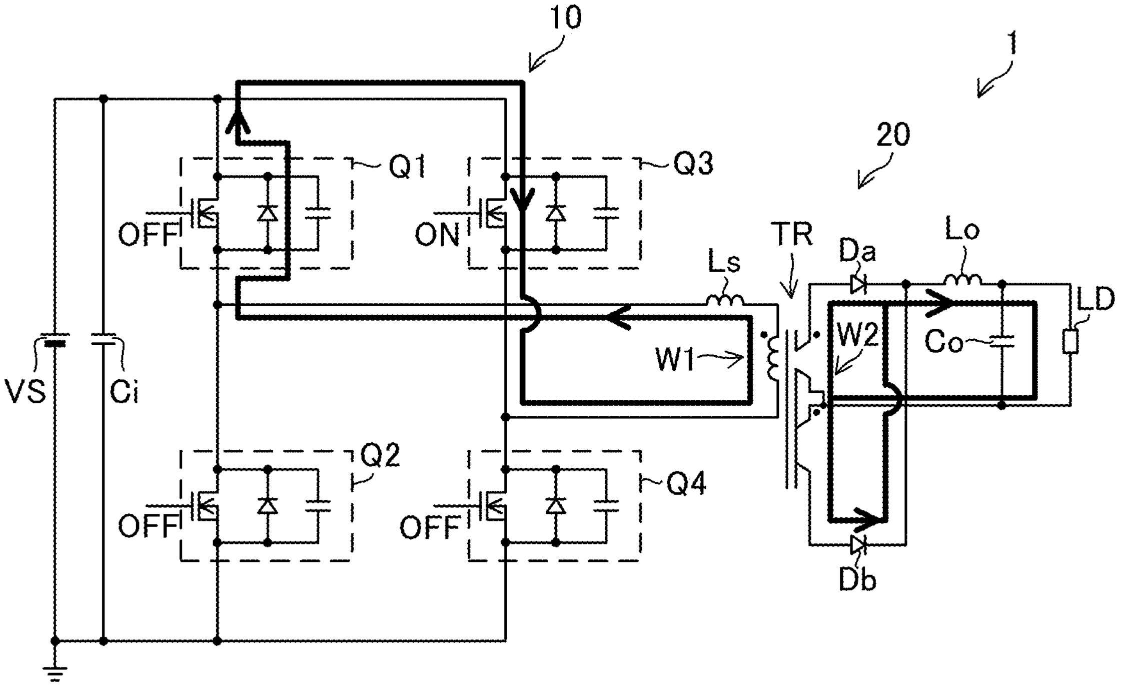

FIG.10
[MD11]
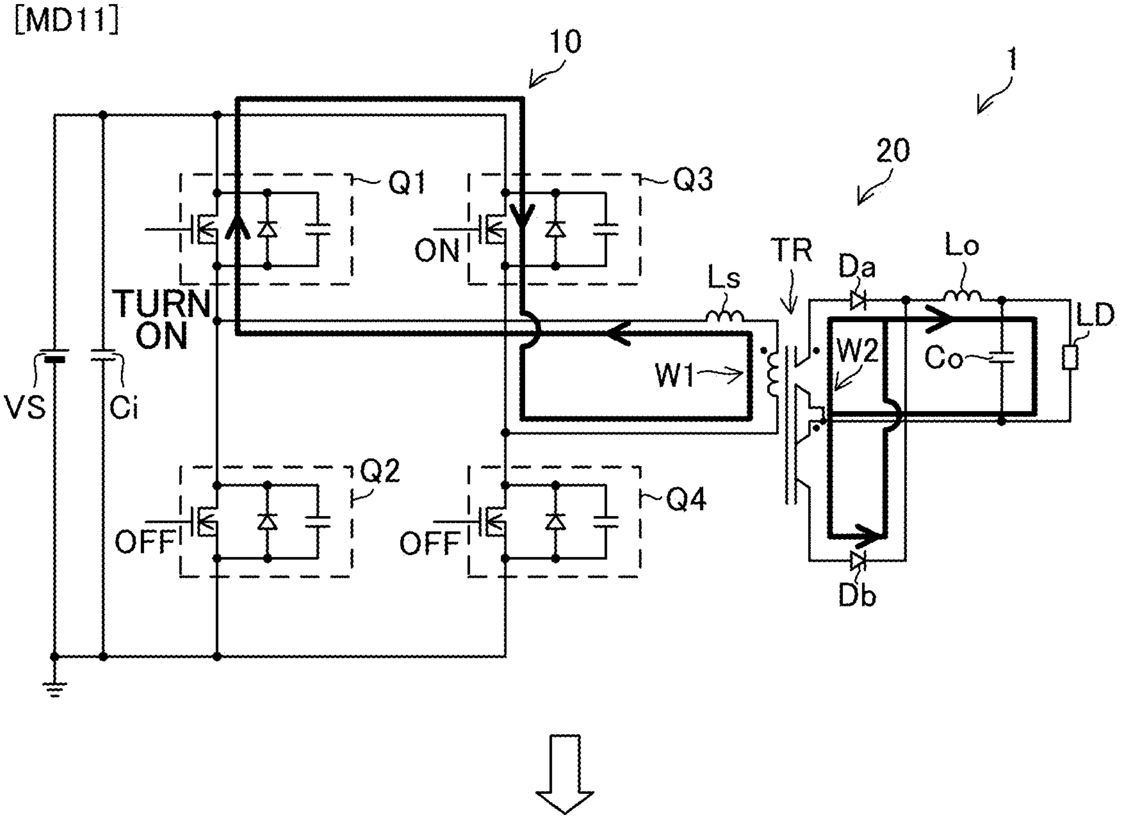
[MD12]
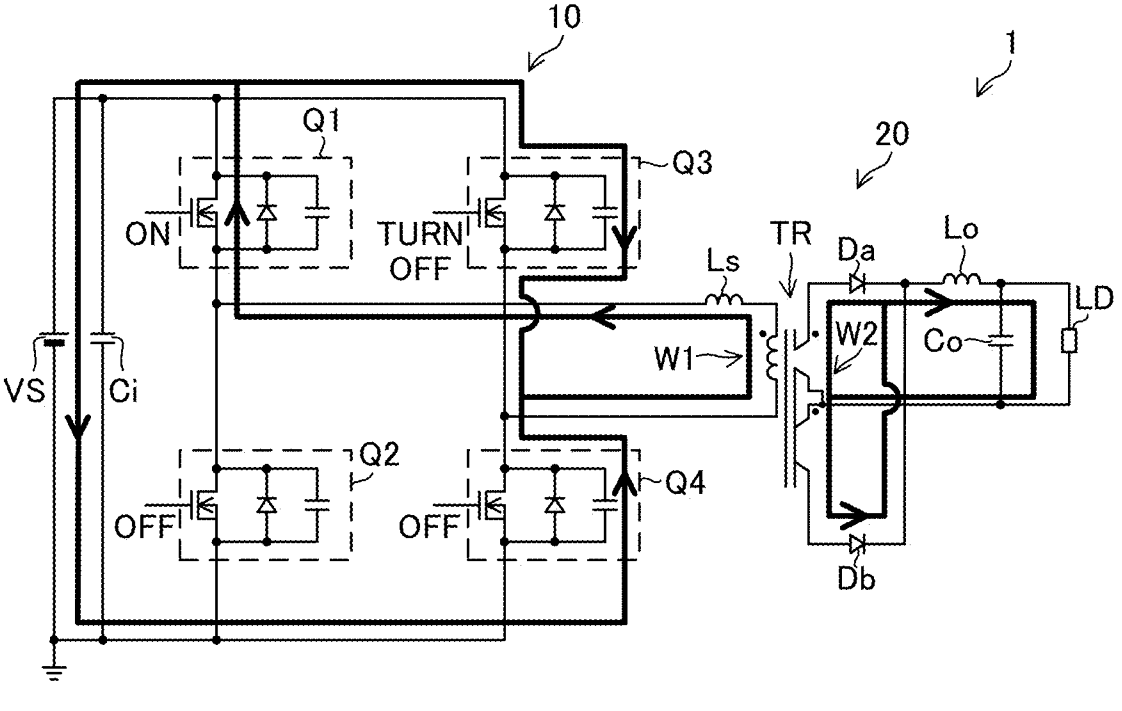

FIG.11
[MD13]
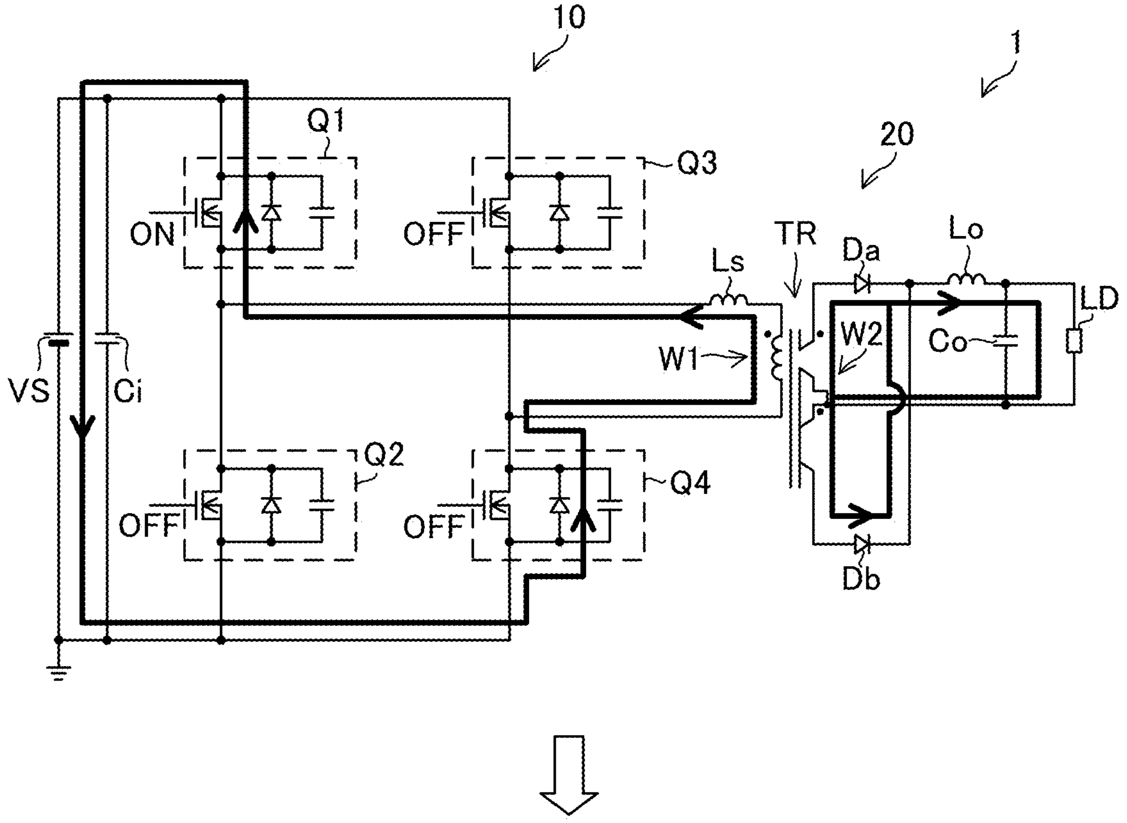
[MD14]
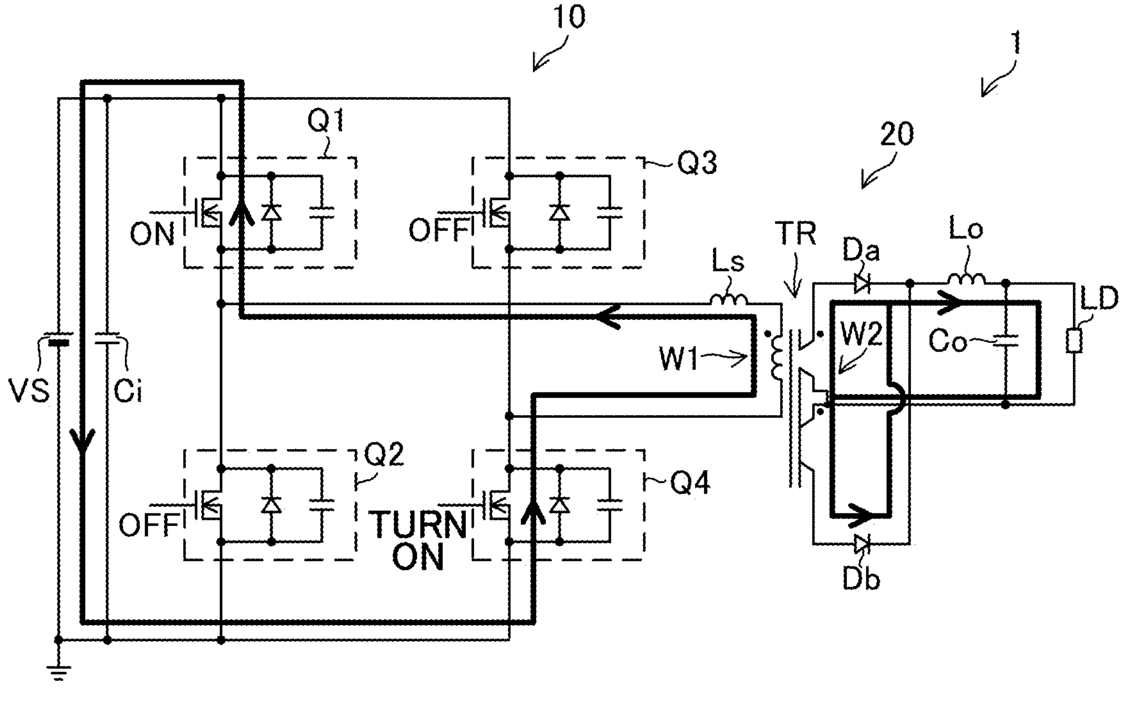

FIG.19

| LEAD FRAME | EXTERNAL TERMINAL |
|---|---|
| SUPPLY LEAD FRAME (LF_P) | SUPPLY TERMINAL (P) |
| REFERENCE LEAD FRAME (LF_N) | REFERENCE TERMINAL (N) |
| 1ST PARTICULAR LEAD FRAME (LF_U) | 1ST PARTICULAR TERMINAL (U) |
| 2ND PARTICULAR LEAD FRAME (LF_W) | 2ND PARTICULAR TERMINAL (W) |
| 3RD PARTICULAR LEAD FRAME (LF_D) | 3RD PARTICULAR TERMINAL (D) |
| 1ST GATE LEAD FRAME | 1ST GATE TERMINAL (G1) |
| 2ND GATE LEAD FRAME | 2ND GATE TERMINAL (G2) |
| 3RD GATE LEAD FRAME | 3RD GATE TERMINAL (G3) |
| 4TH GATE LEAD FRAME | 4TH GATE TERMINAL (G4) |
| 1ST SOURCE LEAD FRAME | 1ST SOURCE TERMINAL (S1) |
| 2ND SOURCE LEAD FRAME | 2ND SOURCE TERMINAL (S2) |
| 3DR SOURCE LEAD FRAME | 3RD SOURCE TERMINAL (S3) |
| 4TH SOURCE LEAD FRAME | 4TH SOURCE TERMINAL (S4) |

SWITCHING DEVICE AND POWER SUPPLY DEVICE

CROSS-REFERENCE TO RELATED APPLICATIONS

This nonprovisional application is a continuation application of International Patent Application No. PCT/JP2022/040106 filed on Oct. 27, 2022, which claims priority Japanese Patent Application No. 2022-015660 filed on Feb. 3, 2022, the entire contents of which are hereby incorporated by reference.

TECHNICAL FIELD

The present disclosure relates to switching devices and power supply devices.

BACKGROUND ART

A known power supply device employing a transformer is provided with, in a primary side, a switching device including a switching transistor and is configured to achieve power conversion by use of that switching device. Here, according to one known scheme, the switching device in the primary side includes four transistors and, by use of these four transistors, the current in the primary winding of the transformer is controlled.

CITATION LIST

Patent Literature

Patent Document 1: JP-A-2016-208725

BRIEF DESCRIPTION OF DRAWINGS

FIG. 6 is a diagram showing the operation (modes MD3 and MD4) of a power supply device according to an embodiment of the present disclosure.

FIG. 7 is a diagram showing the operation (modes MD5 and MD6) of a power supply device according to an embodiment of the present disclosure.

FIG. 8 is a diagram showing the operation (modes MD7 and MD8) of a power supply device according to an embodiment of the present disclosure.

FIG. 9 is a diagram showing the operation (modes MD9 and MD10) of a power supply device according to an embodiment of the present disclosure.

FIG. 10 is a diagram showing the operation (modes MD11 and MD12) of a power supply device according to an embodiment of the present disclosure.

FIG. 11 is a diagram showing the operation (modes MD13 and MD14) of a power supply device according to an embodiment of the present disclosure.

FIG. 19 is a diagram showing the correspondence between a plurality of lead frames and a plurality of external terminals according to an embodiment of the present disclosure.

FIG. 28 is a diagram showing the interconnections among the six semiconductor elements according to the third practical example belonging to an embodiment of the present disclosure.

DESCRIPTION OF EMBODIMENTS

Examples of implementing the present disclosure will be described below specifically with reference to the accompanying drawings. Among the diagrams referred to in the course, the same parts are identified by the same reference signs, and in principle no overlapping description of the same parts will be repeated. In the present description, for the sake of simplicity, symbols and reference signs referring to information, signals, physical quantities, elements, parts, and the like are occasionally used with omission or abbreviation of the names of the information, signals, physical quantities, elements, parts, and the like corresponding to those symbols and reference signs. For example, the first particular lead frame described later and identified by the reference sign "LF_U" (see FIG. 19) is sometimes referred to as "first particular lead frame LF_U" and other times abbreviated to "particular lead frame LF_U" or "lead frame LF_U" simply, all referring to the same entity.

First, some of the terms used to describe embodiments of the present disclosure will be defined. For any transistor configured as an FET (field-effect transistor), which can be a MOSFET, "on state" refers to a state where the transistor is conducting between its drain and source, and "off state" refers to a state where the transistor is not conducting (is cut off) between its drain and source. Similar definitions apply to any transistor that is not classified as an FET. Unless otherwise stated, any MOSFET can be understood to be an enhancement MOSFET. "MOSFET" is an abbreviation of "metal-oxide-semiconductor field-effect transistor". Unless otherwise stated, for any MOSFET, its back gate can be understood to be short-circuited to its source.

For any transistor, a switch from the off state to the on state is referred to as a turning-on, and a switch from the on state to the off state is referred to as a turning-off. For any transistor, a period in which it is in the on state is often referred to as the on period, and a period in which it is in the off state is often referred to as the off period. In the following description, for any transistor, its being in the on or off state is occasionally expressed simply as its being on or off respectively.

Unless otherwise stated, wherever "connection" is discussed among a plurality of parts constituting a circuit, as among given circuit elements, wirings (wires), nodes, terminals, electrodes, and the like, the term is to be understood to denote "electrical connection".

Figure 1:
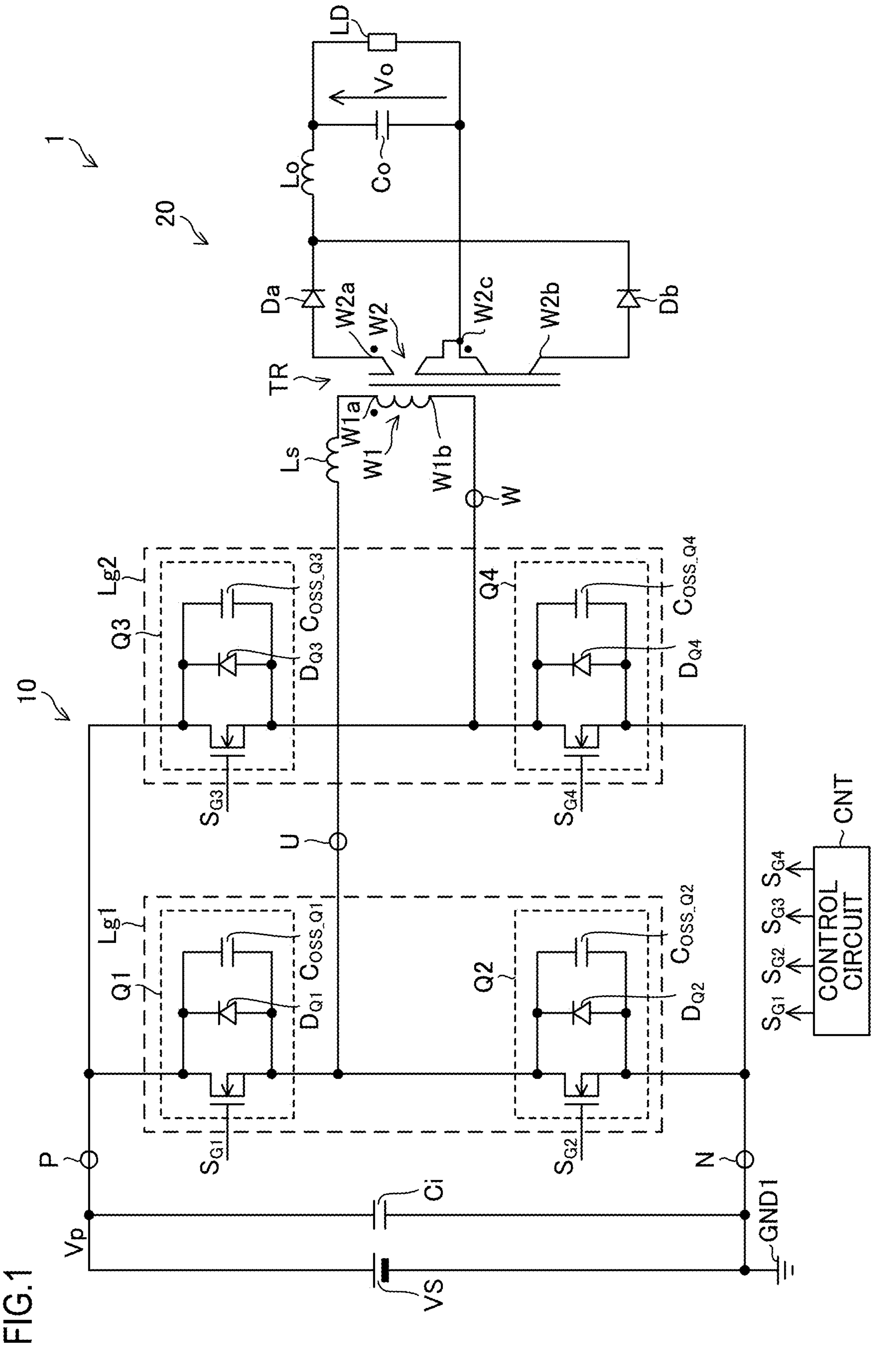
FIG. 1 is a diagram showing the overall configuration of a power supply device according to an embodiment of the present disclosure.

FIG. 1 is a circuit diagram of a power supply device 1 according to an embodiment of the present disclosure. The power supply device 1 is an isolated DC/DC converter that includes a transformer TR. While the power supply device 1 taken up here is of a forward type, it may instead be of a flyback type.

The power supply device 1 includes a primary circuit 10 and a secondary circuit 20. The primary circuit 10 is provided in the primary side of the power supply device 1, and the secondary circuit 20 is provided in the secondary side of the power supply device 1. The primary side of the power supply device 1 and the primary side of the transformer TR refer to the same circuit segment, and the secondary side of the power supply device 1 and the secondary side of the transformer TR refer to the same circuit segment. The primary and secondary circuits 10 and 20 are electrically isolated from each other. The transformer TR has a primary winding W1 on the primary side and a secondary winding W2 on the secondary side.

In the transformer TR, the primary and secondary windings W1 and W2 are electrically isolated from each other, and are magnetically coupled together with identical polarities. The first and second terminals of the primary winding W1 of the transformer TR will be identified by the symbols "W1*a*" and "W1*b*" respectively. The first and second terminals of the secondary winding W2 of the transformer TR will be identified by the symbols "W2*a*" and "W2*b*" respectively. The transformer TR has a center tap W2*c* at the middle of the secondary winding W2.

The power supply device 1 includes, in addition to the transformer TR, a voltage source VS, an input capacitor Ci, transistors (switching transistors) Q1 to Q4, a series-added inductor Ls, a control circuit CNT, diodes Da and Db, an output inductor Lo, and an output capacitor Co. Of these, the voltage source VS, the input capacitor Ci, the transistors Q1 to Q4, the series-added inductor Ls, and the control circuit CNT are included in the primary circuit 10. The diodes Da and Db, the output inductor Lo, and the output capacitor Co are included in the secondary circuit 20. Moreover, terminals P, N, U, and W are provided in the primary circuit 10.

A load LD is provided in the secondary side of the power supply device 1. The load LD can be any load that is connected to the power supply device 1 to operate from an output voltage Vo of the power supply device 1.

In the power supply device 1, the control circuit CNT controls the states of the transistors Q1 to Q4 so as to transmit electric power from the primary winding W1 to the secondary winding W2 of the transformer TR and thereby produce in the secondary circuit 20 the output voltage Vo based on a supply voltage Vp. While in reality the power supply device 1 has a diode connected in parallel with the transistor Q1 and a diode connected in parallel with the transistor Q2, in FIG. 1 those diodes are not illustrated (the function etc. of those diodes will be described later).

In the primary circuit 10, a ground GND1 refers to a reference conductor at a reference potential of 0 V (zero volts), or to a potential of 0 V itself. The reference conductor is formed of a conductive material such as metal. In the primary circuit 10, any voltage mentioned with no reference mentioned is a potential relative to the ground GND1. The terminal N is connected to the ground GND1.

The voltage source VS is connected to the terminals N and P and supplies the supply voltage Vp to the terminal P relative to the potential at the terminal N. The supply voltage Vp is a positive direct-current voltage (i.e., a voltage with a potential higher than the potential at the terminal N). Accordingly, the terminal P is fed with a potential higher than that at the terminal N by the supply voltage Vp. For example, the voltage source VS is a battery comprising a secondary cell. Instead, the voltage source VS can be configured with, for example, a circuit that rectifies an alternating-current voltage to produce a direct-current voltage.

One terminal of the input capacitor Ci is connected to the terminal N and the other terminal of the input capacitor Ci is connected to the terminal P. Thus, across the terminals of the input capacitor Ci is applied the supply voltage Vp.

The transistors Q1 to Q4 are each an N-channel MOSFET. Here, the transistors Q1 to Q4 are assumed to be MOSFETs formed using SiC (silicon carbide). Instead, MOSFETs formed using any semiconductor material (e.g., gallium nitride or silicon) other than silicon carbide can be used as the transistors Q1 to Q4. A modification is also possible where the transistors Q1 to Q4 are implemented as N-channel insulated-gate bipolar transistors (IGBTs).

The transistors Q1 to Q4 are each accompanied by a body diode, which is a parasitic diode, and an output capacitance, which is a parasitic capacitance. The body diode and the output capacitance of the transistor Q1 are identified by the symbols "$D_{Q1}$" and "$C_{OSS\_Q1}$" respectively. The body diode and the output capacitance of the transistor Q2 are identified by the symbols "$D_{Q2}$" and "$C_{OSS\_Q2}$" respectively. The body diode and the output capacitance of the transistor Q3 are identified by the symbols "$D_{Q3}$" and "$C_{OSS\_Q3}$" respectively. The body diode and the output capacitance of the transistor Q4 are identified by the symbols "$D_{Q4}$" and "$C_{OSS\_Q4}$" respectively.

In each of the transistors Q1 to Q4, the body diode is present between the drain and the source of the transistor to have a forward direction pointing from the source to the drain of the transistor. Accordingly, for example, the body diode $D_{Q1}$ is present between the drain and the source of the transistor Q1 and has a forward direction pointing from the source to the drain of the transistor Q1. A similar description applies to the body diodes $D_{Q2}$ to $D_{Q4}$. In each of the transistors Q1 to Q4, the output capacitance includes the parasitic capacitance present between the drain and the source of the transistor. Accordingly, for example, the output capacitance $C_{OS\_Q1}$ includes the parasitic capacitance present between the drain and the source of the transistor Q1. A similar description applies to the output capacitances $C_{OSS\_Q2}$ to $C_{OSS\_Q4}$. The output capacitance $C_{OSS\_Q1}$ can be understood to further include the parasitic capacitance present between the drain and the gate of the transistor Q1. A similar description applies to the output capacitances $C_{OSS\_Q2}$ to $C_{OSS\_Q4}$.

The drains of the transistors Q1 and Q3 are connected to the terminal P. The sources of the transistors Q2 and Q4 are connected to the terminal N. The source of the transistor Q1 and the drain of the transistor Q2 are connected to the terminal U. The source of the transistor Q3 and the drain of the transistor Q4 are connected to the terminal W.

The terminal U is connected via the series-added inductor Ls to the first terminal W1*a* of the primary winding W1. That is, between the connection node between the source of the transistor Q1 and the drain of the transistor Q2 and the first terminal W1*a* of the primary winding W1, the series-added inductor Ls is inserted. The terminal U lies between the connection node between the source of the transistor Q1 and the drain of the transistor Q2 and the series-added inductor Ls. The terminal W is connected to the second terminal W1*b* of the primary winding W1. The terminal W lies between the connection node between the source of the transistor Q3 and the drain of the transistor Q4 and the second terminal W1*b* of the primary winding W1.

Of the secondary winding W2, the first terminal W2*a* is connected to the anode of the diode Da and the second terminal W2*b* is connected to the anode of the diode Db. The diodes Da and Db function as rectifying diodes. The cathodes of the diodes Da and Db are connected to the first terminal of the output inductor Lo. Between the second terminal of the output inductor Lo and the center tap W2*c* of the secondary winding W2, the output capacitor Co is provided. Across the terminals of the output capacitor Co appears the output voltage Vo relative to the potential at the center tap W2*c*. The load LD is connected across the terminals of the output capacitor Co.

The control circuit CNT generates gate signals $S_{G1}$ to $S_{G4}$; it feeds the gate signals $S_{G1}$, $S_{G2}$, $S_{G3}$, and $S_{G4}$ to the gates of the transistors Q1, Q2, Q3, and Q4 respectively and thereby controls the states (on/off state) of the transistors Q1 to Q4. The gate signals $S_{G1}$ to $S_{G4}$ each take as its signal level either high or low level. When a gate signal is at high level, the corresponding transistor is on and, when a gate signal is at low level, the corresponding transistor is off. Accordingly, for example, when the gate signal $S_{G1}$ is at high level, the transistor Q1 is on and, when the gate signal $S_{G1}$ is at low level, the transistor Q1 is off. A similar description applies to how the states of the transistors Q2 to Q4 are controlled according to the gate signals $S_{G2}$ to $S_{G4}$.

The transistors Q1 to Q4 constitute a full bridge (full-bridge circuit). The control circuit CNT controls the transistors Q1 to Q4 such that these constitute a phase-shift full-bridge circuit. In the following description, the phase-shift full-bridge circuit will occasionally be referred to as the PSFB circuit. The PSFB circuit achieves zero-voltage switching operation (hereinafter referred to as ZVS operation) of the transistors Q1 to Q4 when these turn on. The ZVS operation of the transistor Q1 means turning on the transistor Q1 while its drain-source voltage is substantially 0 V. The ZVS operation of the transistor Q1 helps keep the turn-on loss of the transistor Q1 sufficiently low. A similar description applies to the ZVS operation of the transistors Q2 to Q4.

The PSFB circuit has a leading leg Lg1 and a lagging leg Lg2. Each of these legs is composed of a pair of transistors connected in series with each other. The leading leg Lg1 is constituted by the transistors Q1 and Q2 and the lagging leg Lg2 is constituted by the transistors Q3 and Q4.

The control circuit CNT generates the gate signals $S_{G1}$ to $S_{G4}$ so as to carry out ZVS operation in the transistors Q1 to Q4. The gate signals $S_{G1}$ to $S_{G4}$ for carrying out ZVS operation can be generated by any method, known or not. The control circuit CNT can generate the gate signals $S_{G1}$ to $S_{G4}$ according to the current through the terminal U, the current through the terminal W, or the output voltage Vo.

Figure 2:
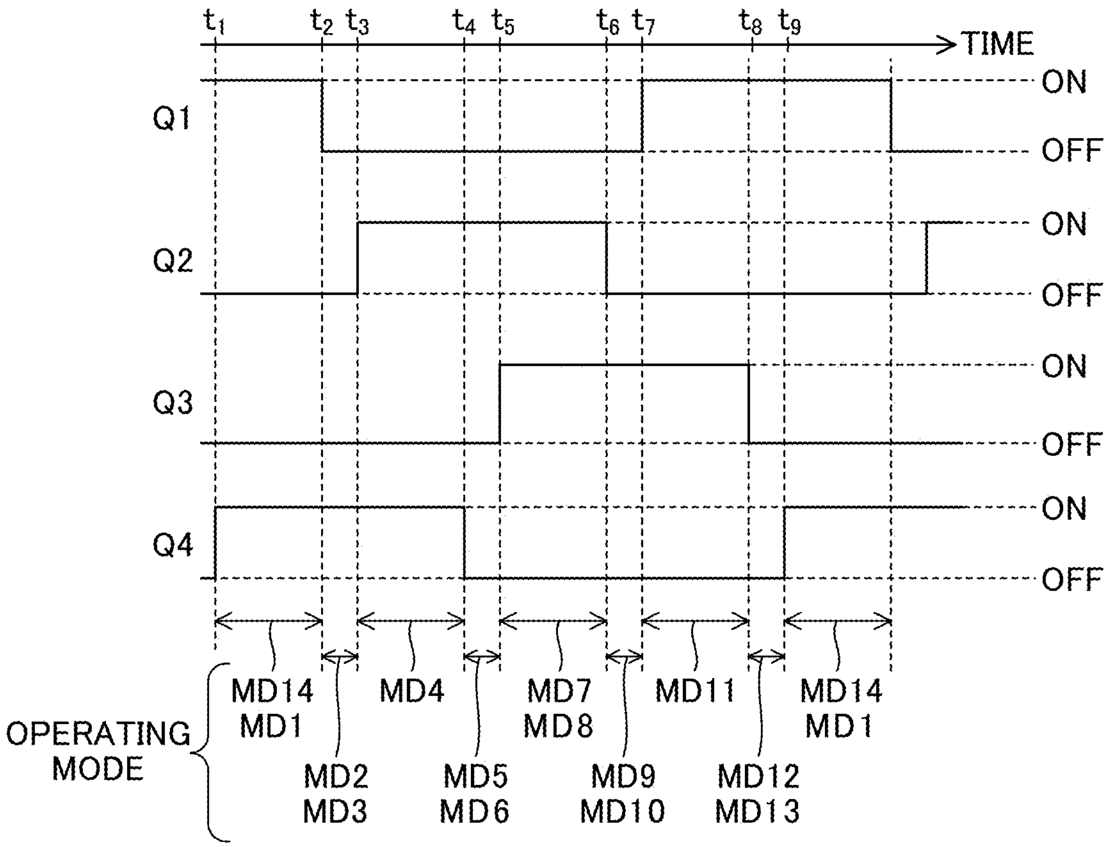
FIG. 2 a timing chart related to state control for transistors according to an embodiment of the present disclosure.

FIG. 2 is a timing chart related to state control for the transistors Q1 to Q4. For any integer i, time $t_{i+1}$ is a time later than time $t_i$. With time $t_1$ taken as the starting point, under the control of the control circuit CNT, the PSFB circuit repeatedly performs a unit operation sequence that lasts from time $t_1$ to time $t_9$. The time to in one unit operation sequence coincides with the time $t_1$ in the next unit operation sequence.

The transistors Q1, Q2, Q3, and Q4 are,
- between times $t_1$ and $t_2$, on, off, off, and on respectively;
- between times $t_2$ and $t_3$, off, off, off, and on respectively;
- between times $t_3$ and $t_4$, off, on, off, and on respectively;
- between times $t_4$ and $t_5$, off, on, off, and off respectively;
- between times $t_5$ and $t_6$, off, on, on, and off respectively;
- between times $t_6$ and $t_7$, off, off, on, and off respectively;
- between times $t_7$ and $t_8$, on, off, on, and off respectively; and
- between times $t_8$ and $t_9$, on, off, off, and off respectively.

The PSFB circuit operates in one of modes MD1 to MD14, which correspond to a first to a fourteenth mode. As shown in FIG. 2, the operating mode of the PSFB circuit,
- between times $t_1$ and $t_2$, changes through mode MD14 to mode MD1;
- between times $t_2$ and $t_3$, changes through mode MD2 to mode MD3;
- between times $t_3$ and $t_4$, stays in MD4;

between times $t_4$ and $t_5$, changes through mode MD5 to mode MD6;

between times $t_5$ and $t_6$, changes through mode MD7 to mode MD8;

between times $t_6$ and $t_7$, changes through mode MD9 to mode MD10;

between times $t_7$ and $t_8$, stays in MD11; and between times $t_8$ and $t_9$, changes through mode MD12 to mode MD13.

As will be understood from the timing chart in FIG. 2, first the on/off states of the transistors Q1 and Q2 are interchanged and then, with a given phase delay, the on/off states of the transistors Q3 and Q4 are interchanged. Thus, generally, the leg constituted by the transistors Q1 and Q2 is called the leading leg and the leg constituted by the transistors Q3 and Q4 is called the lagging leg.

Figure 3:
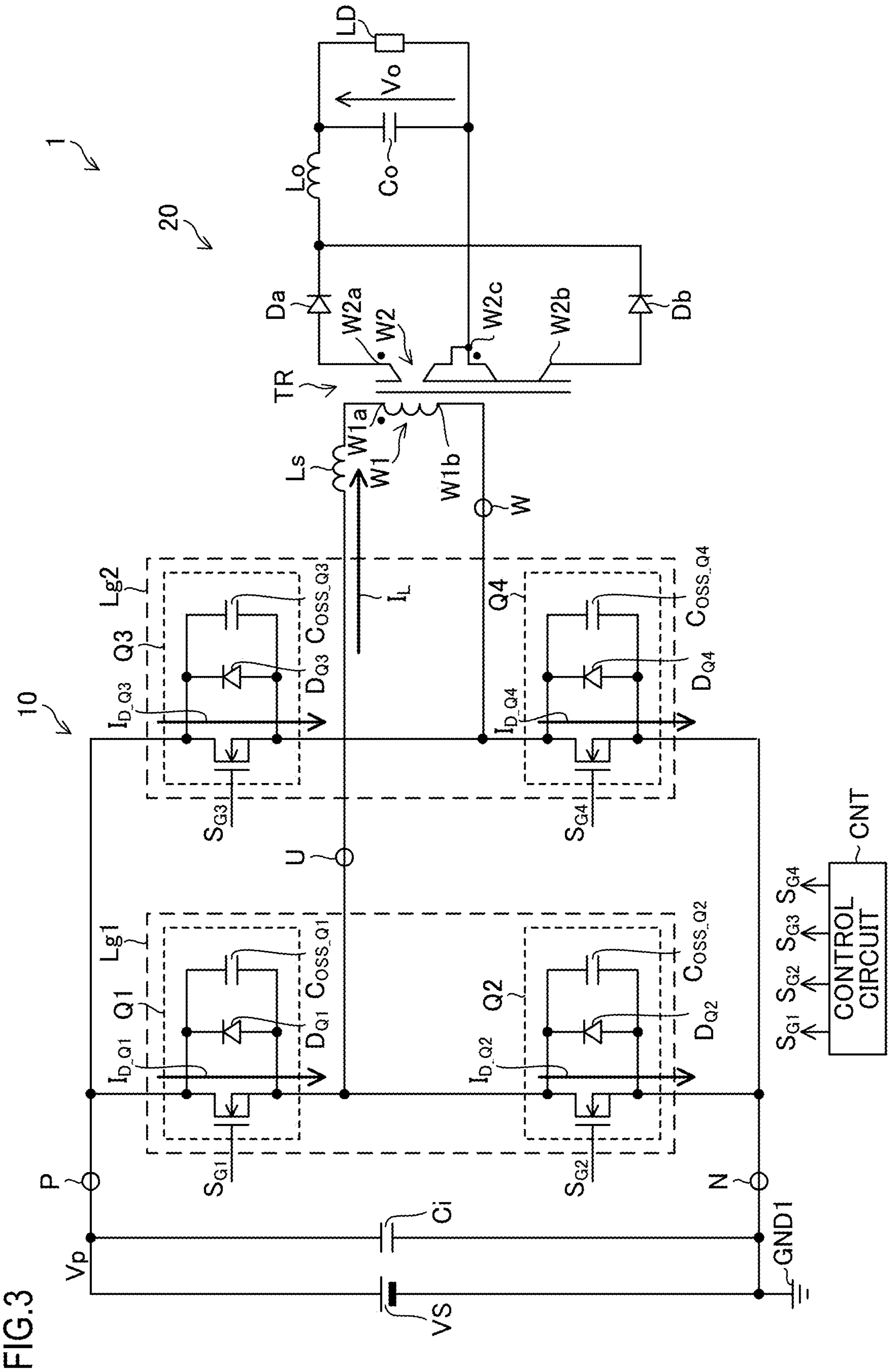
FIG. 3 is a diagram defining relevant currents in a power supply device according to an embodiment of the present disclosure.
Figure 4:
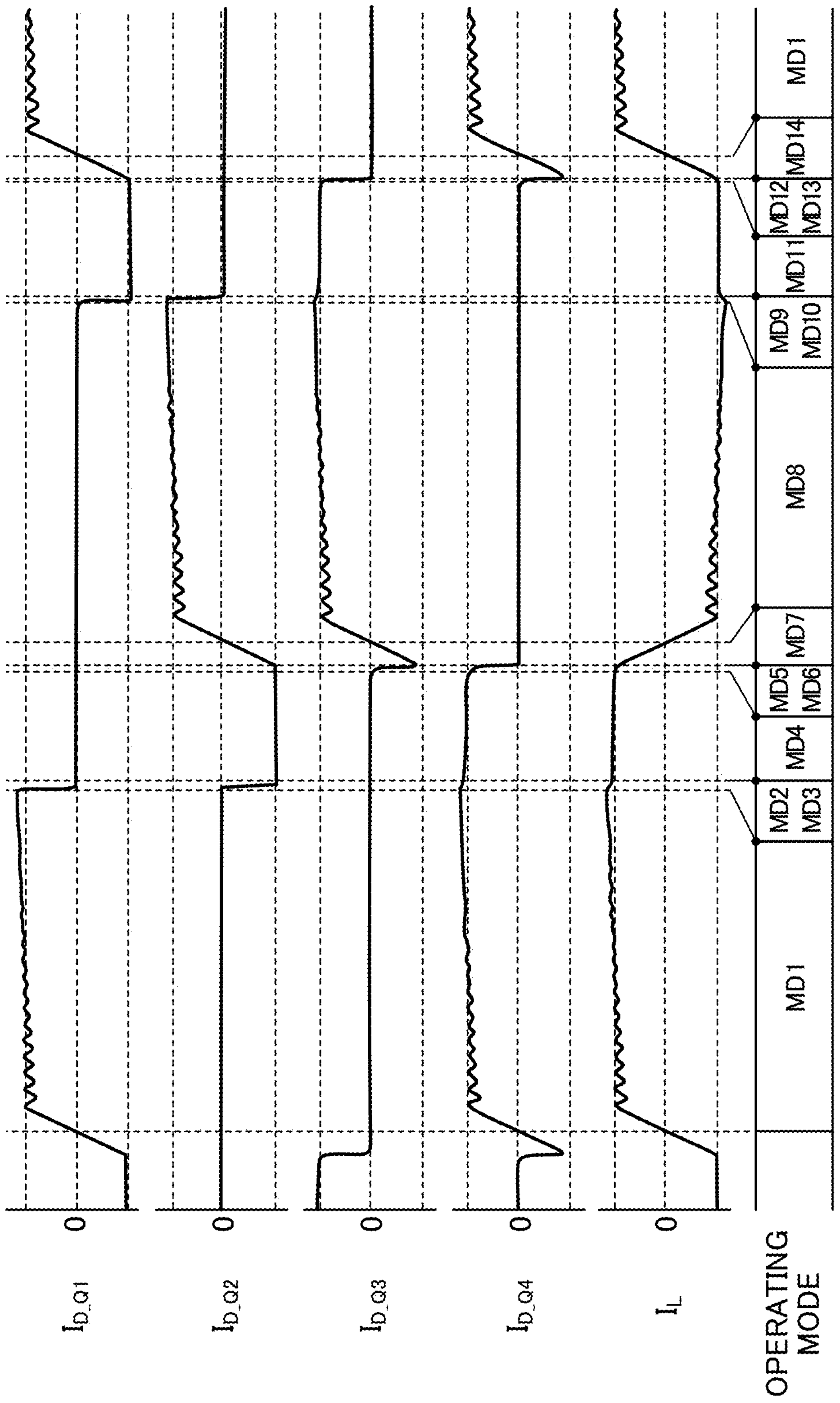
FIG. 4 is a diagram showing the waveforms of relevant currents in a power supply device according to an embodiment of the present disclosure.

Referring to FIG. 3, the drain currents through the transistors Q1, Q2, Q3, and Q4 are represented by the symbols "$I_{D\_Q1}$", "$I_{D\_Q2}$", "$I_{D\_Q3}$", and "$I_{D\_Q4}$" respectively. Note here that the drain current $I_{D\_Q1}$ can be understood to be the sum of the current through the channel of the transistor Q1, the current through the body diode $D_{Q1}$, and the current through the output capacitance $C_{OSS\_Q1}$. The current through the primary winding W1 is referred to as the primary current and is represented by the symbol "$I_L$". The polarity of the drain current $I_{D\_Q1}$ passing from the drain to the source of the transistor Q1 is assumed to be positive. A similar description applies to the drain currents $I_{D\_Q2}$ to $I_{D\_Q4}$. The polarity of the primary current $I_L$ passing through the primary winding W1 from the first terminal W1*a* to the second terminal W2*b* is assumed to be positive. FIG. 4 shows, from top down, the waveforms of the drain currents $I_{D\_Q1}$, $I_{D\_Q2}$, $I_{D\_Q3}$, and $I_{D\_Q4}$ and the waveform of the primary current $I_L$, and below the primary current $I_L$ is shown the transition of the operating mode of the PSFB circuit in a form coordinated with the waveforms.

In the configuration shown in FIG. 3, the transistors Q1 to Q4 each act as a switch in the PSFB circuit. ZVS operation with respect to a given switch is accomplished by turning that switch on while its output capacitance is discharging and a forward current is passing through its body diode.

As shown in FIG. 4, a period in which the drain current $I_{D\_Q1}$ is negative, a period in which the drain current $I_{D\_Q2}$ is negative, a period in which the drain current $I_{D\_Q3}$ is negative, and a period in which the drain current $I_{D\_Q4}$ is negative occur separately. For example, with respect to the transistor Q3, its drain current $I_{D\_Q3}$ is negative in the period in which the PSFB circuit operates in mode MD7 and turning the transistor Q3 on during that period (the period of mode MD7) accomplishes the ZVS operation of the transistor Q3. Likewise, turning the transistor Q1 on during the period (the period of mode MD11) in which the drain current $I_{D\_Q1}$ is negative accomplishes the ZVS operation of the transistor Q1. Likewise, turning the transistor Q2 on during the period (the period of mode MD4) in which the drain current $I_{D\_Q2}$ is negative accomplishes the ZVS operation of the transistor Q2. Likewise, turning the transistor Q4 on during the period (the period of mode MD14) in which the drain current $I_{D\_Q4}$ is negative accomplishes the ZVS operation of the transistor Q4.

Referring to FIGS. 5 to 11, the operation of the power supply device 1 in each mode will be described starting with mode MD1. In FIGS. 5 to 11, arrowed solid lines indicate how currents pass in each mode.

Figure 5:
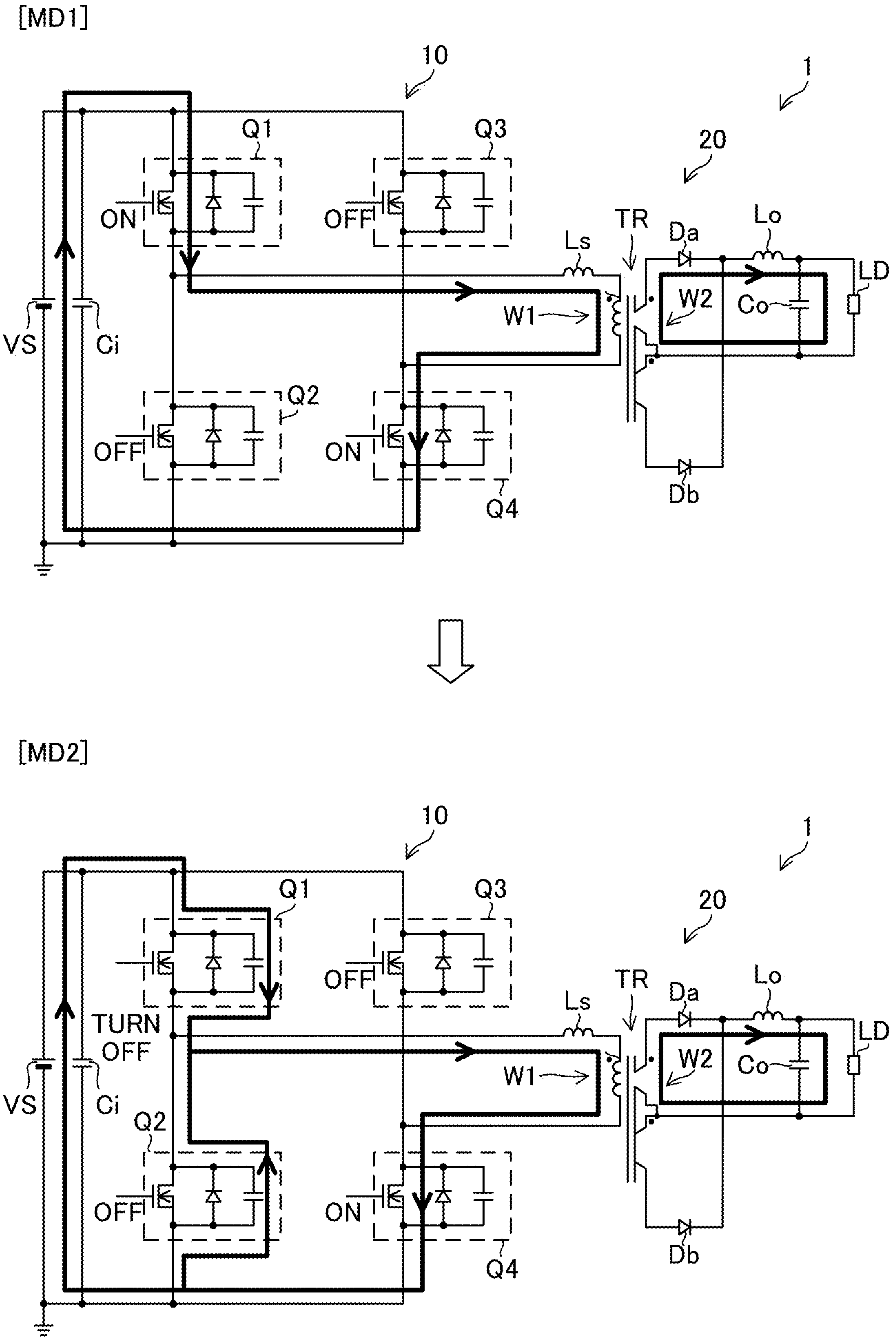
FIG. 5 is a diagram showing the operation (modes MD1 and MD2) of a power supply device according to an embodiment of the present disclosure.

In mode MD1, the transistors Q1 and Q4 are on and the transistors Q2 and Q3 are off (see FIG. 5). With the transistors Q2 and Q3 off, the output capacitances $C_{OSS\_Q2}$ and $C_{OSS\_Q3}$ of the transistors Q2 and Q3 are charged. In mode MD1, with the transistors Q1 to Q4 on, the primary winding W1 is fed with the supply voltage Vp, and a positive primary current ($I_L$) passes through the channels of the transistors Q1 to Q4. Thus, a current passes in the direction to charge the output capacitor Co, through the diode Da, the output inductor Lo, and the output capacitor Co, and energy is stored in the series-added inductor Ls.

In mode MD2, the transistor Q1 turns off (see FIG. 5). With the transistor Q1 turned off, the output capacitance $C_{OSS\_Q1}$ of the transistor Q1 starts to be charged. Thus, the drain potential of the transistor Q2 falls and accordingly, at the same time that the output capacitance $C_{OSS\_Q1}$ starts to be charged, the output capacitance $C_{OSS\_Q2}$ starts to be discharged. Moreover, in mode MD2, a positive primary current ($I_L$) passes through the output capacitances $C_{OSS\_Q1}$ and $C_{OSS\_Q2}$, the series-added inductor Ls, and the channel of the transistor Q4. Thus, a current passes in the direction to charge the output capacitor Co, through the diode Da, the output inductor Lo, and the output capacitor Co.

In mode MD3, the charging of the output capacitance $C_{OSS\_Q1}$ and the discharging of the output capacitance $C_{OSS\_Q2}$ are completed (see FIG. 6). Even after completion of the charging of the output capacitance $C_{OSS\_Q1}$ and the discharging of the output capacitance $C_{OSS\_Q2}$, if energy is stored in the series-added inductor Ls, back-flow operation starts in which a positive primary current ($I_L$) passes via the body diode $D_{Q2}$, the series-added inductor Ls, the primary winding W1, and the channel of the transistor Q4. In the back-flow operation, while no energy is transmitted from the primary side to the secondary side, the output inductor Lo so functions as to keep a current passing through the output inductor Lo. In mode MD3, a current passes through the output inductor Lo via both the diodes Da and Db (the same applies to modes MD4 to MD7).

In mode MD4, the transistor Q2 turns on (see FIG. 6). At this point, the body diode $D_{Q2}$ is conducting and thus the drain-source voltage of the transistor Q2 is substantially 0 V. That is, ZVS operation of the transistor Q2 is carried out.

In mode MD5, the transistor Q4 turns off (see FIG. 7). With the transistor Q4 turned off, the output capacitance $C_{OSS\_Q4}$ of the transistor Q4 starts to be charged. Thus, the source potential of the transistor Q3 rises and accordingly, at the same time that the output capacitance $C_{OSS\_Q4}$ starts to be charged, the output capacitance $C_{OSS\_Q3}$ starts to be discharged.

In mode MD6, the charging of the output capacitance $C_{OSS\_Q4}$ and the discharging of the output capacitance $C_{OSS\_Q3}$ are completed (see FIG. 7). Even after completion of the charging of the output capacitance $C_{OSS\_Q4}$ and the discharging of the output capacitance $C_{OSS\_Q3}$, if energy is stored in the series-added inductor Ls, back-flow operation starts in which a positive primary current ($I_L$) passes via the body diode $D_{Q3}$, the voltage source VS (or the input capacitor Ci), the channel of the transistor Q2, the series-added inductor Ls, and the primary winding W1.

In mode MD7, the transistor Q3 turns on (see FIG. 8). At this point, the body diode $D_{Q3}$ is conducting and thus the drain-source voltage of the transistor Q3 is substantially 0 V. That is, ZVS operation of the transistor Q3 is carried out. With the transistor Q3 turned on, the energy stored in the series-added inductor Ls is discharged quickly, and the direction of the current in the primary circuit 10 is reversed quickly from that in mode MD6. Mode MD7 corresponds to a state immediately before the reversal, and the state after the reversal corresponds to mode MD8.

In mode MD8, the transistors Q2 and Q3 are on and transistors Q1 to Q4 are off (see FIG. 8). With the transistors Q1 to Q4 off, the output capacitances $C_{OSS\_Q1}$ and $C_{OSS\_Q4}$ of the transistors Q1 to Q4 are charged. In mode MD8, with the transistors Q2 and Q3 on, the primary winding W1 is fed with the supply voltage Vp in the direction reverse to that in the mode MD1, with the result that a negative primary current ($I_L$) passes through the channels of the transistors Q2 and Q3. Here, a current passes in the direction to charge the output capacitor Co, through the diode Db, the output inductor Lo, and the output capacitor Co, and energy is stored in the series-added inductor Ls.

In mode MD9, the transistor Q2 turns off (see FIG. 9). With the transistor Q2 turned off, the output capacitance $C_{OSS\_Q2}$ of the transistor Q2 starts to be charged and at the same time the output capacitance $C_{OSS\_Q1}$ starts to be discharged. Moreover, in mode MD9, a negative primary current ($I_L$) passes through the output capacitances $C_{OSS\_Q1}$ and $C_{OSS\_Q2}$, the series-added inductor Ls, and the channel of the transistor Q3. Thus, a current passes in the direction to charge the output capacitor Co, through the diode Db, the output inductor Lo, and the output capacitor Co.

In mode MD10, the charging of the output capacitance $C_{OSS\_Q2}$ and the discharging of the output capacitance $C_{OSS\_Q1}$ are completed (see FIG. 9). Even after completion of the charging of the output capacitance $C_{OSS\_Q2}$ and the discharging of the output capacitance $C_{OSS\_Q1}$, if energy is stored in the series-added inductor Ls, back-flow operation starts in which a negative primary current ($I_L$) passes via the body diode $D_{Q1}$, the channel of the transistor Q3, the primary winding W1, and the series-added inductor Ls. In the back-flow operation, while no energy is transmitted from the primary side to the secondary side, the output inductor Lo so functions as to keep a current passing through the output inductor Lo. In mode MD10, a current passes through the output inductor Lo via both the diodes Da and Db (the same applies to modes MD11 to MD14).

In mode MD11, the transistor Q1 turns on (see FIG. 10). At this point, the body diode $D_{Q1}$ is conducting and thus the drain-source voltage of the transistor Q1 is substantially 0 V. That is, ZVS operation of the transistor Q1 is carried out.

In mode MD12, the transistor Q3 turns off (see FIG. 10). With the transistor Q3 turned off, the output capacitance $C_{OSS\_Q3}$ of the transistor Q3 starts to be charged and at the same time the output capacitance $C_{OSS\_Q4}$ starts to be discharged.

In mode MD13, the charging of the output capacitance $C_{OSS\_Q3}$ and the discharging of the output capacitance $C_{OSS\_Q4}$ are completed (see FIG. 11). Even after completion of the charging of the output capacitance $C_{OSS\_Q3}$ and the discharging of the output capacitance $C_{OSS\_Q4}$, if energy is stored in the series-added inductor Ls, back-flow operation starts in which a negative primary current ($I_L$) passes via the body diode $D_{Q4}$, the primary winding W1, the series-added inductor Ls, the channel of the transistor Q1, and the voltage source VS (or the input capacitor Ci).

In mode MD14, the transistor Q4 turns on (see FIG. 11). At this point, the body diode $D_{Q4}$ is conducting and thus the drain-source voltage of the transistor Q4 is substantially 0 V. That is, ZVS operation of the transistor Q4 is carried out. With the transistor Q4 turned on, the energy stored in the series-added inductor Ls is discharged quickly, and the direction of the current in the primary circuit 10 is reversed quickly from that in mode MD13. Mode MD14 corresponds to a state immediately before the reversal, and the state after the reversal corresponds to mode MD1.

As will be understood from the description of modes MD5, MD6, MD12, and MD13, when the condition that the energy stored in the series-added inductor Ls is higher than the energy stored in the output capacitances $C_{OSS\_Q3}$ and $C_{OSS\_Q4}$ is fulfilled, their charging and discharging are completed and ZVS operation is carried out. With focus on mode MD5, the condition is expressed by Expression (1) below. In the left side of Expression (1), Ls represents the inductance value of the series-added inductor Ls and $I_{L1}$ represents the value of the primary current $I_L$ at the end of mode MD4. In the right side of Expression (1), $E_{OSS\_Q3}$ represents the energy needed for completion of the discharging of the output capacitance $C_{OSS\_Q3}$ that is started in mode MD5, and $E_{OSS\_Q4}$ represents the energy needed for completion of the charging of the output capacitance $C_{OSS\_Q4}$ that is started in mode MD5.

$$(1/2)\cdot Ls\cdot I_{L1}^2 > E_{OSS\_Q3} + E_{OSS\_Q4} \tag{1}$$

In a light-load state, the current value $I_{L1}$ is low; in a heavy-load state, the current value $I_{L1}$ is high. A light-load state refers to a state where the power consumption by the load LD is comparatively low and a heavy-load state refers to a state where the power consumption by the load LD is comparatively high. As will be understood from Expression (1), in a light-load state, a low current value $I_{L1}$ makes ZVS operation difficult to carry out; in a heavy-load state, a high current value $I_{L1}$ makes ZVS operation easy to carry out.

For easy fulfillment of Expression (1), it is preferable to employ MOSFETs with a low output capacitance as the transistors Q1 to Q4. For example, MOSFETs formed using SiC (silicon carbide) can be employed as the transistors Q1 to Q4.

Note however that, in a heavy-load state, the body diodes of the transistors (Q14) require a long recovery time Trr. In the leading leg Lg1, when a transistor (Q1, Q2) turns off, if a recovery current remains, a parasitic bipolar transistor in the transistor (Q1, Q2) may turn on spontaneously (this will be referred to as erroneous turning-on). The parasitic bipolar transistor in the transistor Q1 is a bipolar transistor formed within the structure of the transistor Q1 as a MOSFET (the same applies to the transistor Q2 and the like). Erroneous turning-on of the parasitic bipolar transistor in the transistor Q1 may destroy the transistor Q1 (the same applies to the transistor Q2 and the like).

Figure 12:
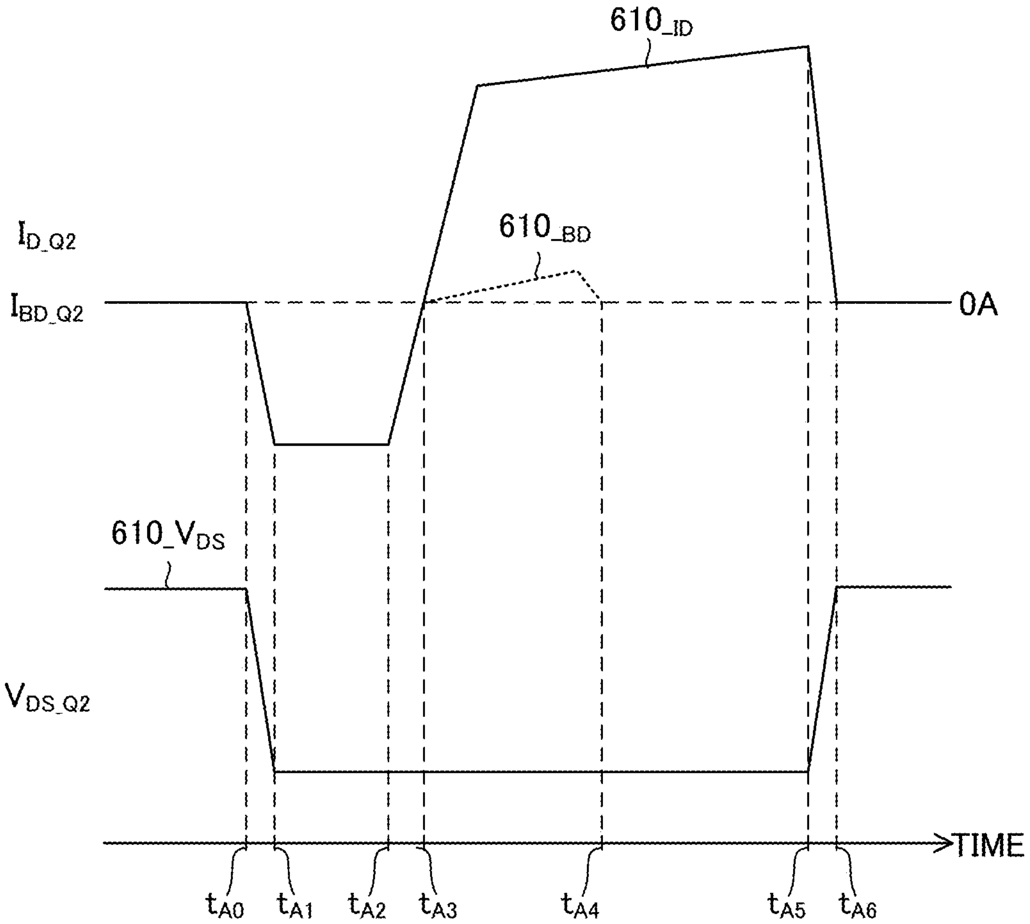
FIG. 12 is a diagram showing the waveforms of currents and a voltages in a transistor (MOSFET) according to an embodiment of the present disclosure.

Referring to FIG. 12, with focus on the transistor Q2, the relationship among the drain-source voltage, the drain current, and the recovery current of a MOSFET will be described. In FIG. 12, a solid-line waveform 610_$V_{DS}$ is the waveform of the drain-source voltage $V_{DS\_Q2}$ of the transistor Q2, a solid-line waveform 610_$I_D$ is the waveform of the drain current $I_{D\_Q2}$ of the transistor Q2. In FIG. 12, a deflected broken-line waveform 610_$I_{BD}$ shown between times $t_{A3}$ and $t_{A4}$ is the waveform of the recovery current $I_{BD\_Q2}$ of the body diode $D_{Q2}$. In FIG. 12, the polarity of a recovery current $I_{BD\_Q2}$ pointing from the cathode to the anode of the body diode $D_{Q2}$ is assumed to be positive.

For any integer i, time $t_{Ai+1}$ is a time later than time $t_{Ai}$. In FIG. 12, the period between times $t_{A0}$ and $t_{A1}$ corresponds to the period in which the PSFB circuit operates in mode MD2 or MD3, the period between times $t_{A1}$ and $t_{A2}$ corresponds to the period in which the PSFB circuit operates in mode MD4, MD5, or MD6, the period between times $t_{A2}$ and $t_{A3}$ corresponds to the period in which the PSFB circuit operates in mode MD7, and the period between times $t_{A3}$ and $t_{A5}$ corresponds to the period in which the PSFB circuit operates in mode MD8 (see also FIG. 4).

Between times $t_{A0}$ and $t_{A1}$, the output capacitance $C_{OSS\_Q2}$ discharges and a forward current stats to pass through the body diode $D_{Q2}$. The period between times $t_{A1}$ and $t_{A3}$ is the period in which the body diode $D_{Q2}$ conducts. At time $t_{A1}$, the transistor Q2 turns on. The period between times $t_{A1}$ and $t_{A5}$ is the period in which the transistor Q2 is on. The period between times $t_{A3}$ and $t_{A4}$ is the period in which the recovery current $I_{BD\_Q2}$ passes through the body diode $D_{Q2}$. Between times $t_{A5}$ and $t_{A6}$, the transistor Q2 turns off.

Figure 13:
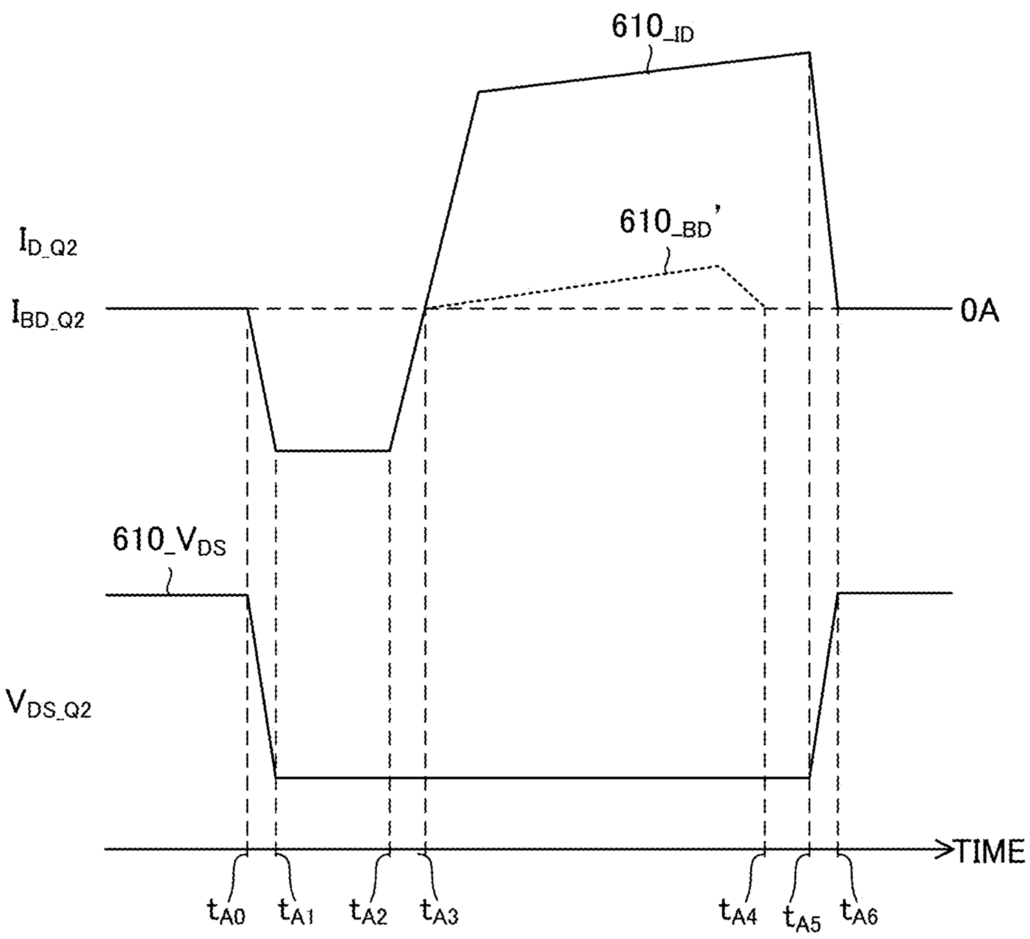
FIG. 13 is a diagram showing the waveforms of currents and a voltages in a transistor (MOSFET) according to an embodiment of the present disclosure.

As the recovery time Trr of the body diode $D_{Q2}$ increases, the waveform of the recovery current $I_{BD\_Q2}$ changes from the deflected broken-line waveform 610_$I_{BD}$ in FIG. 12 to the deflected broken-line waveform 610_$I_{BD}$' in FIG. 13. In the behavior in FIG. 13, the recovery current $I_{BD\_Q2}$ becomes zero before the transistor Q2 turns off. If, however, the recovery time Trr of the body diode $D_{Q2}$ increases further until electric charge remains in the transistor Q2 when it turns off, the parasitic bipolar transistor of the transistor Q2 is likely to turn on erroneously.

In the PSFB circuit, the on period of a transistor (Q3, Q4) in the lagging leg Lg2 is longer than the on period of a transistor (Q1, Q2) in the leading leg Lg1 (see FIG. 4). Accordingly, in the lagging leg Lg2, even if a body diode has a comparatively long recovery period, it can complete its recovery within the on period of the transistor (Q3, Q4). Thus, the lagging leg Lg2 has less concern of erroneous turning-on of a parasitic bipolar transistor.

With the foregoing taken into consideration, the power supply device 1 according to the embodiment has a diode connected in parallel with a transistor included in the PSFB circuit. In the PSFB circuit, a diode connected in parallel with a transistor is referred to specifically as an erroneous turning-on prevention diode. A first erroneous turning-on prevention diode connected in parallel with the transistor Q1 will be referred to as the diode D1 and a second erroneous turning-on prevention diode connected in parallel with the transistor Q2 will be referred to as the diode D2.

Figure 14:
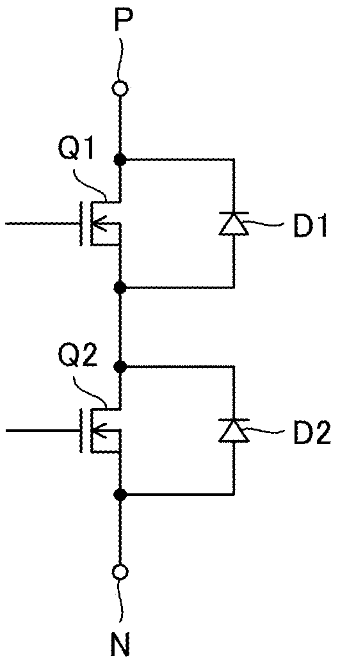
FIG. 14 is a diagram showing diodes connected each in parallel with one of two transistors according to an embodiment of the present disclosure.

FIG. 14 shows the relationship between the transistors Q1 and Q2 and the diodes D1 and D2. The diode D1 is an element provided separately from the transistor Q1 and is connected in parallel with the transistor Q1. The diode D2 is an element provided separately from the transistor Q2 and is connected in parallel with the transistor Q2. Specifically, the anode of the diode D1 is connected to the source of the transistor Q1, and the cathode of the diode D1 is connected to the drain of the transistor Q1. The anode of the diode D2 is connected to the source of the transistor Q2, and the cathode of the diode D2 is connected to the drain of the transistor Q2. Thus, the diodes D1 and D2 have their forward direction pointing from the terminal N to the terminal P.

An erroneous turning-on prevention diode is provided to suppress erroneous turning-on of a parasitic bipolar transistor and to suppress the adverse effects of the erroneous turning-on. Accordingly, in the power supply device 1, of the transistors Q1 to Q4, only the transistors Q1 and Q2, which are more prone to erroneous turning-on, have an erroneous turning-on prevention diode connected in parallel with each of them. Specifically, the power supply device 1 has, only for the transistors Q1 and Q2, erroneous turning-on prevention diodes (D1, D2) connected in parallel with them, and includes no erroneous turning-on prevention diodes for the transistors Q3 and Q4.

A modification is however possible in which the power supply device 1 is provided with, in addition to the first and second erroneous turning-on prevention diodes (diodes D1 and D2), a third erroneous turning-on prevention diode (diode D3, unillustrated) and a fourth erroneous turning-on prevention diode (diode D4, unillustrated), with the third erroneous turning-on prevention diode connected in parallel with the transistor Q3 and the fourth erroneous turning-on prevention diode connected in parallel with the transistor Q4.

As an erroneous turning-on prevention diode, a diode with a comparatively short recovery time Trr is suitable. Preferably, a diode of which the recovery characteristics (including recovery time Trr) vary little with variation of the drain current of the transistor with which it is connected in parallel, or with variation of temperature, is employed as an erroneous turning-on prevention diode.

Figure 15:
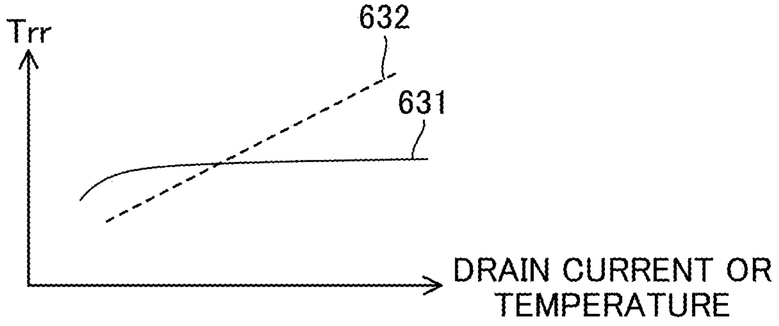
FIG. 15 is a diagram showing the recovery characteristics of two types of diodes according to an embodiment of the present disclosure.

Out of those considerations, a Shottky barrier diode formed using SiC (silicon carbide) is employed as an erroneous turning-on prevention diode. A Shottky barrier diode formed using SiC (silicon carbide) is referred to as a SiC-SBD. Specifically, the diodes D1 and D2 are SiC-SBDs. In FIG. 15, a solid-line waveform 631 schematically represents the recovery characteristics of a SIC-SBD and a broken-line waveform 632 schematically represents the recovery characteristics of a fast-recovery diode formed using Si (silicon) (hereinafter referred to as a Si-FRD). Compared with a Si-FRD or the like, a SiC-SBD has recovery characteristics (including recovery time Trr) that vary little with variation of the drain current of a transistor, or with variation of temperature, and also has a lower forward voltage and a lower parasitic capacitance.

So long as erroneous turning-on can be prevented, any kind of diode other than a SiC-SBD can be used as an erroneous turning-on prevention diode. A fast-recovery diode or a Shottky barrier diode formed using a semiconductor material (e.g., silicon) other than silicon carbide can be used as each erroneous turning-on prevention diode (i.e., as each of the diodes D1 and D2).

Connecting an erroneous turning-on prevention diode (D1, D2) in parallel with each transistor (Q1, Q2) in the leading leg Lg1 as described above helps suppress erroneous turning-on of a parasitic bipolar transistor, and hence helps suppress the adverse effects of erroneous turning-on. It is thus possible to operate each transistor as desired and to ensure stable operation of the power supply device 1.

Preferably, the diode D1 is disposed as close as possible to the transistor Q1. It is thus possible to minimize the recovery time Trr of the diode provided between the drain and the source of the transistor Q1 (to promote, among others, the effect of reducing the recovery time Trr resulting from the addition of the diode D1). Likewise, the diode D2 is preferably disposed as close as possible to the transistor Q2.

The transistors Q1 to Q4 can be configured as discrete components, and the diodes D1 and D2 too can be configured as discrete components. All or some of the transistors Q1 to Q4 and the diodes D1 and D2 can be built into a module. The following description of the embodiment assumes that a semiconductor device having the transistors Q1 to Q4 and the diodes D1 and D2 built into a module is provided as a switching device in the power supply device 1.

Figure 16:
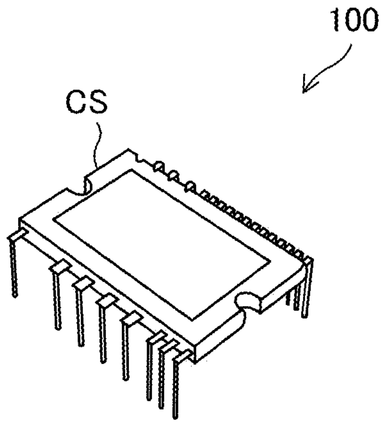
FIG. 16 is an exterior perspective view of a semiconductor device according to an embodiment of the present disclosure.

FIG. 16 is an exterior perspective view of a semiconductor device 100 as an example of a switching device. The semiconductor device 100 can be provided in the power supply device 1. The semiconductor device 100 includes six semiconductor elements, namely transistors Q1 to Q4 and diodes D1 and D2. The semiconductor device 100 is an electronic component that includes the six semiconductor elements, namely the transistors Q1 to Q4 and the diodes D1 and D2, a package (case) CS that houses those six semiconductor elements, and a plurality of external terminals that are exposed out of the package CS to outside the semiconductor device 100. Sealing the six semiconductor elements in the package (case) CS formed of resin yields the semiconductor device 100. The six semiconductor elements are isolated from each other inside the semiconductor device 100 (except for the necessary electrical interconnections among them). The number of external terminals, and the type of package, of the semiconductor device 100 shown in FIG. 16 are merely illustrative, and can be designed as desired.

Figure 17:
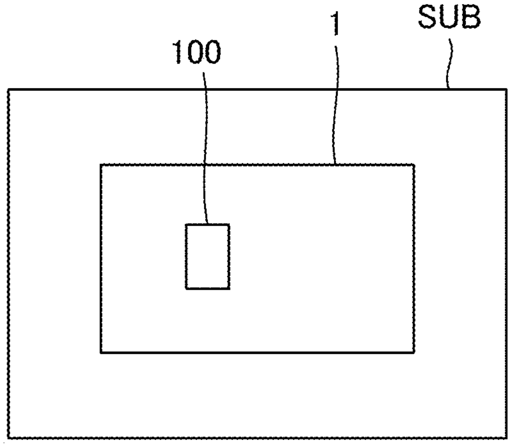
FIG. 17 is a diagram showing how a power supply device including the semiconductor device in FIG. 16 is mounted on a substrate according to an embodiment of the present disclosure.

Referring to FIG. 17, a substrate (printed circuit board) on which the power supply device 1 is mounted will be referred to as the target substrate SUB. The components (including the semiconductor device 100) that constitute the power supply device 1 are mounted on the target substrate SUB. The target substrate SUB can be composed of two or more substrates that are connected together with a connector. Compared with mounting the above-mentioned six semiconductor elements as discrete elements on a substrate, mounting the semiconductor device 100 having the six semiconductor elements built into a module on the target substrate SUB results in smaller distances required for isolation among the semiconductor elements and hence a higher mounting density.

The semiconductor device 100 includes a plurality of lead frames. The lead frames are each a metal member formed of copper or iron as the main material. Each lead frame can be a piece of thin sheet metal. All or some of the lead frames in the semiconductor device 100 have a function of supporting and fixing a semiconductor element inside the semiconductor device 100 and a function of electrically connecting together a semiconductor element inside the semiconductor device 100 and an external wiring of the semiconductor device 100. In the semiconductor device 100, unless otherwise stated, any two lead frames are disposed apart from each other and are isolated from each other.

Figure 18:
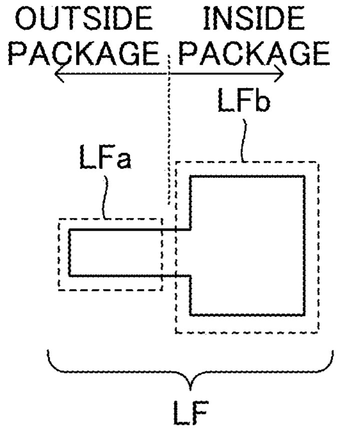
FIG. 18 is a diagram showing the structure of a lead frame according to an embodiment of the present disclosure.

FIG. 18 shows a lead frame LF as one example of a lead frame that can be provided in the semiconductor device 100. Each lead frame has an outer lead, which is a metal part that is exposed out of the package CS (specifically, exposed out of the package CS to outside the semiconductor device 100), and an inner lead, which is a metal part that is located inside the package CS. In FIG. 18, a metal part LFa is the outer lead of the lead frame LF and a metal part LFb is the inner lead of the lead frame LF. FIG. 18 only schematically shows the shape of the lead frame LF; each lead frame in the semiconductor device 100 can have any shape.

FIG. 19 shows the correspondence between the plurality of lead frames and a plurality of external terminals provided in the semiconductor device 100.

The semiconductor device 100 has, as the plurality of lead frames, a supply lead frame, a reference lead frame, a first to a third particular lead frame, a first to a fourth gate lead frame, and a first to a fourth source lead frame. The semiconductor device 100 can have any lead frames other than these. The supply lead frame and the reference lead frame are identified specifically by the symbols "LF_P" and "LF_N" respectively. The first, second, and third particular lead frames are identified specifically by the symbols "LF_U", "LF_W", and "LF_D".

The semiconductor device 100 has, as the plurality of external terminals, a supply terminal P, a reference terminal N, a first particular terminal U, a second particular terminal W, a third particular terminal D, a first to a fourth gate terminal G1 to G4, and a first to a fourth source terminal S1 to S4. The semiconductor device 100 can have any terminals other than these terminals. The supply terminal P, the reference terminal N, the first particular terminal U, and the second particular terminal W correspond to the terminals P, N, U, and W, respectively, described previously with reference to FIG. 1. The third particular terminal D is an external terminal for connection between the erroneous turning-on prevention diodes D1 and D2 and the transistors Q1 and Q2. While FIG. 1 does not show the third particular terminal D and the erroneous turning-on prevention diodes D1 and D2, these are shown in some of the diagrams referred to later. The third particular terminal D, however, can be omitted from the semiconductor device 100.

The first to fourth gate terminals G1 to G4 are external terminals that are connected to the gates (gate electrodes) of the transistors Q1 to Q4 respectively. The first to fourth source terminals S1 to S4 are external terminals that are connected to the sources (source electrodes) of the transistors Q1 to Q4 respectively. The gate terminals G1 to G4 and the source terminals S1 to S4 are connected, outside the semiconductor device 100, via a plurality of wiring patterns formed on the target substrate SUB to the control circuit CNT (see FIG. 1). The control circuit CNT feeds a gate signal $S_{G1}$ to the gate terminal G1 relative to the potential at the source terminal S1, feeds a gate signal $S_{G2}$ to the gate terminal G2 relative to the potential at the source terminal S2, feeds a gate signal $S_{G3}$ to the gate terminal G3 relative to the potential at the source terminal S3, and feeds a gate signal $S_{G4}$ to the gate terminal G4 relative to the potential at the source terminal S4.

Some of the external terminals can be shared. For example, the source terminals S2 and S4 can be integrated into one external terminal that functions as the source terminals S2 and S4. For another example, the source terminals S2 and S4 and the reference terminal N can be integrated into one external terminal that functions as the source terminals S2 and S4 and the reference terminal N. For another example, the source terminal S1 and the particular terminal U can be integrated into one external terminal that functions as the source terminal S1 and the particular terminal U.

The outer lead of the supply lead frame LF_P constitutes the supply terminal P. The outer lead of the reference lead frame LF_N constitutes the reference terminal N. The outer lead of the first particular lead frame LF_U constitutes the first particular terminal U. The outer lead of the second particular lead frame LF_W constitutes the second particular terminal W. The outer lead of the third particular lead frame LF_D constitutes the third particular terminal D. As mentioned above, the third particular terminal D can be omitted from the semiconductor device 100. The outer leads of the first to fourth gate lead frames constitute the first to fourth gate terminals G1 to G4 respectively. The outer leads of the first to fourth source lead frames constitute the first to fourth source terminals S1 to S4 respectively.

Figure 20:
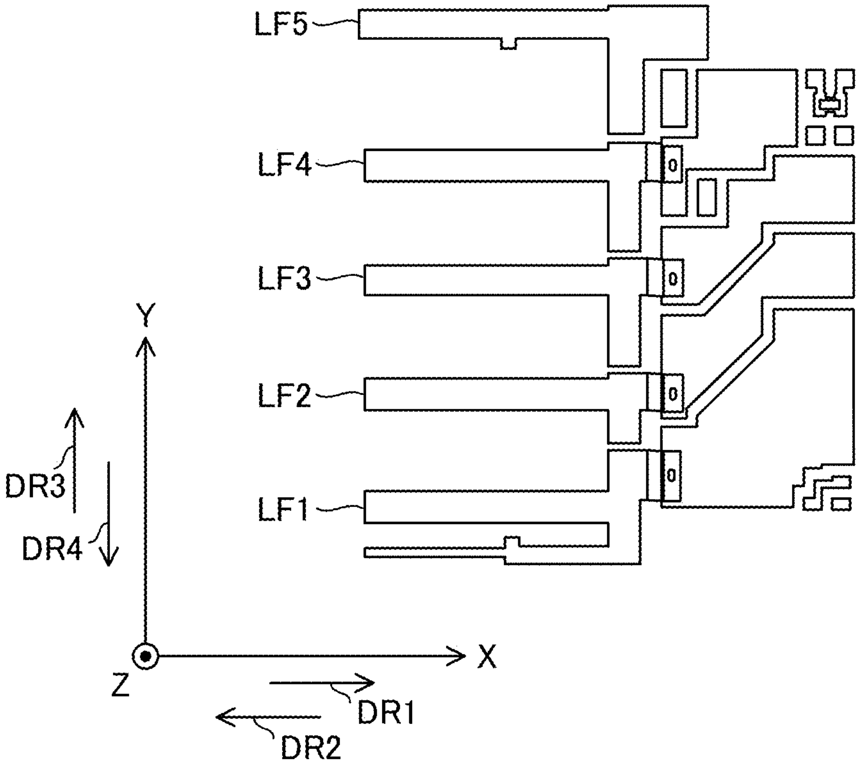
FIG. 20 is a plan view of principal lead frames provided in a semiconductor device according to an embodiment of the present disclosure.
Figure 21:
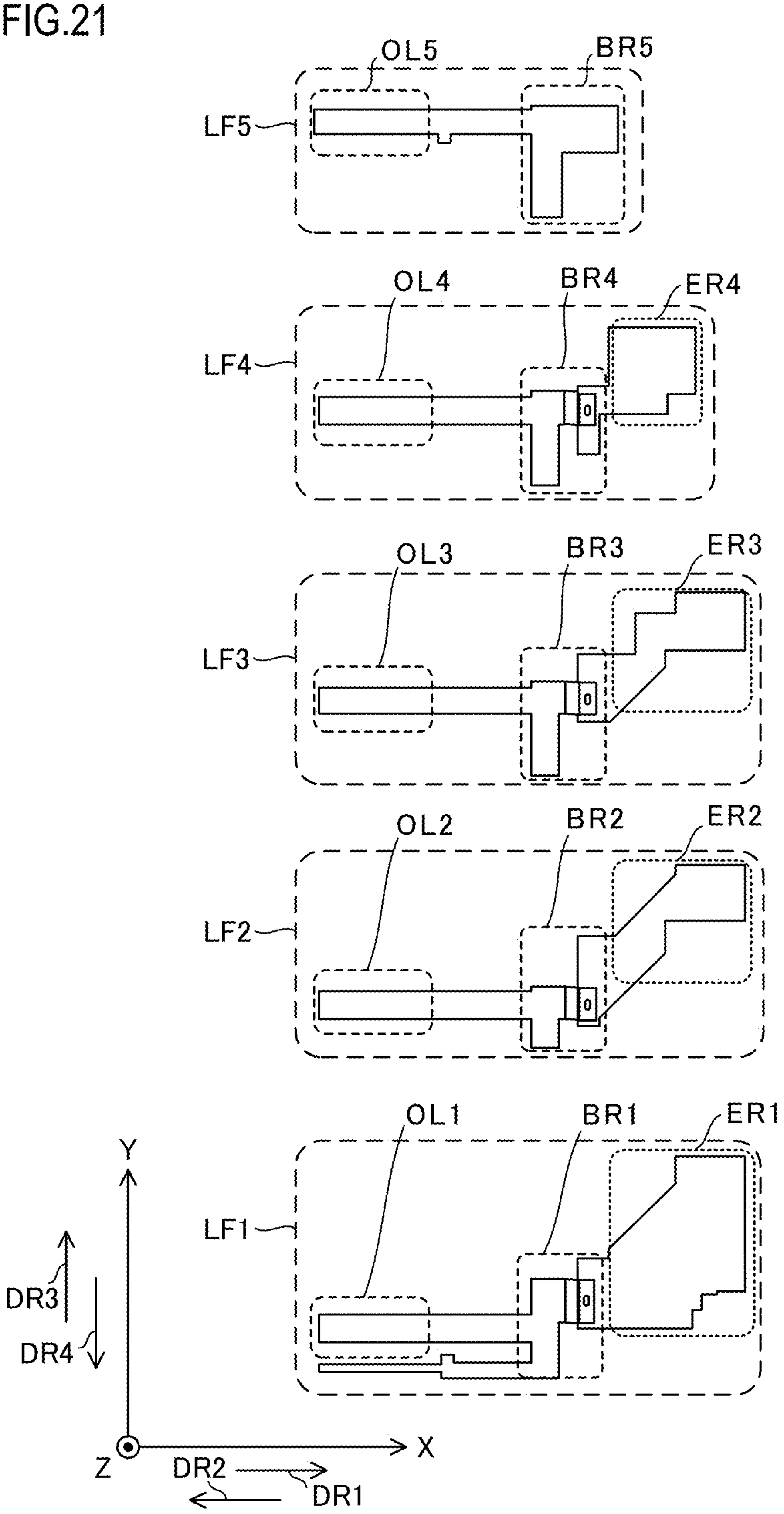
FIG. 21 is an exploded plan view of principal lead frames provided in a semiconductor device according to an embodiment of the present disclosure.

FIG. 20 is a plan view of principal lead frames. Lead frames LF1 to LF5 are provided in the power supply device 100. FIG. 21 is an exploded plan view of the lead frames LF1 to LF5. The lead frames LF1 to LF5 can constitute the lead frames LF_P, LF_N, LF_U, LF_W, and LF_D, and the correspondence among these will be described in the course of the description of practical examples given later. For clear explanation of the positional relationship and the like of the lead frames LF1 to LF5, here are defined three axes that are perpendicular to each other as X-, Y-, and Z-axes. The plane parallel to the X- and Y-axes is referred to as XY-plane. FIGS. 20 and 21 are a plan view and an exploded plan view of the lead frames LF1 to LF5 as viewed along Z-axis. Directions DR1 and DR2 are assumed to be directions parallel to X-axis and opposite to each other, the direction DR1 pointing from the negative to the positive side along X-axis, the direction DR2 pointing from the positive to the negative side along X-axis. Directions DR3 and DR4 are assumed to be directions parallel to Y-axis and opposite to each other, the direction DR3 pointing from the negative to the positive side along Y-axis, the direction DR4 pointing from the positive to the negative side along Y-axis.

The lead frames LF1 to LF5 are disposed side by side along Y-axis. From the negative to the positive side along Y-axis (i.e., in the direction DR3), the lead frames LF1, LF2, LF3, LF4, and LF5 are disposed in this order. Thus, along the Y-axis, the lead frames LF1 and LF2 are adjacent to each other, the lead frames LF2 and LF3 are adjacent to each other, the lead frames LF3 and LF4 are adjacent to each other, and the lead frames LF4 and LF5 are adjacent to each other.

A metal part OL1, which is a part of the lead frame LF1, is the outer lead of the lead frame LF1. A metal part OL2, which is a part of the lead frame LF2, is the outer lead of the lead frame LF2. A metal part OL3, which is a part of the lead frame LF3, is the outer lead of the lead frame LF3. A metal part OL4, which is a part of the lead frame LF4, is the outer lead of the lead frame LF4. A metal part OL5, which is a part of the lead frame LF5, is the outer lead of the lead frame LF5. The outer leads OL1 to OL5 are each a metal part that extends along X-axis. The outer leads OL1 to OL5 can be bent about an axis parallel to Y-axis such that the outer leads OL1 to OL5 eventually form metal parts along Z-axis. The outer leads OL1 to OL5 are disposed side by side along Y-axis. From the negative to the positive side along Y-axis (i.e., in the direction DR3), the outer leads OL1 to OL5 are disposed in this order. Thus, along Y-axis, the outer leads OL1 and OL2 are adjacent to each other, the outer leads OL2 and OL3 are adjacent to each other, the outer leads OL3 and OLA are adjacent to each other, and the outer leads OL4 and OL5 are adjacent to each other.

In each of the lead frames LF1 to LF5, the inner lead is disposed at a position displaced in the direction DR1 as seen from the outer lead. In each of the lead frames LF1 to LF5, a bonding region is provided in the inner lead. In each of the lead frames LF1 to LF4, an element mount region is provided in the inner lead. The bonding regions in the lead frames LF1, LF2, LF3, LF4, and LF5 will be identified by the symbols "BR1", "BR2", "BR3", "BR4", and "BR5" respectively. The element mount regions in the lead frames LF1, LF2, LF3, and LF4 will be identified by the symbols "ER1", "ER2", "ER3", and "ER4" respectively.

In each of the lead frames LF1 to LF5, the bonding region is disposed at a position displaced in the direction DR1 as seen from the outer lead. In each of the lead frames LF1 to LF4, the element mount region is disposed at a position displaced in the direction DR1 as seen from the bonding region. Thus, in the case of the lead frame LF1, along X-axis, the bonding region BR1 is located between the outer lead OL1 and the element mount region ER1. Likewise, in the case of the lead frame LF2, along X-axis, the bonding region BR2 is located between the outer lead OL2 and the element mount region ER2. A similar description applies to the lead frames LF3 and LF4. An element mount region can be provided also in the inner lead of the lead frame LF5.

In each element mount region, one or more semiconductor elements (e.g., transistors or diodes) can be disposed. Each element mount region has a metal mount surface parallel to XY-plane and permits any semiconductor element to be mounted on the metal mount surface. In the semiconductor device 100, any connection (electrical connection) as between a semiconductor element and an inner lead, between two different inner leads, and between two different semiconductor elements can be achieved by wire bonding. In wire bonding, when one end of a wire is connected to a given inner lead, that one end of the wire can be connected to a metal part within the bonding region in the inner lead or a metal part (metal mount surface) within the element mount region in the inner lead. This ensures conduction between the wire and the inner lead. In the description of the embodiment, "in/within/inside the semiconductor device 100" can be read as "in/within/inside the package CS".

The bonding regions BR1 to BR5 are disposed side by side along Y-axis. From the negative to the positive side along the Y-axis (i.e., in the direction DR3), the bonding regions BR1 to BR5 are disposed in this order. Thus, along the Y-axis, the bonding regions BR1 and BR2 are adjacent to each other, the bonding regions BR2 and BR3 are adjacent to each other, the bonding regions BR3 and BR4 are adjacent to each other, and the bonding regions BR4 and BR5 are adjacent to each other. The element mount regions ER1 to ER4 are disposed side by side along the Y-axis. From the negative to the positive side along the Y-axis (i.e., in the direction DR3), the element mount regions ER1 to ER4 are disposed in this order. Thus, along the Y-axis, the element mount regions ER1 and ER2 are adjacent to each other, the element mount regions ER2 and ER3 are adjacent to each other, and the element mount regions ER3 and ER4 are adjacent to each other.

The element mount region ER1 includes a region that extends in the directions DR1 and DR3 as seen from the outer lead OL1 and the bonding region BR1. The element mount region ER2 includes a region that extends in the directions DR1 and DR3 as seen from the outer lead OL2 and the bonding region BR2. The element mount region ER3 includes a region that extends in the directions DR1 and DR3 as seen from the outer lead OL3 and the bonding region BR3. The element mount region ER4 includes a region that extends in the directions DR1 and DR3 as seen from the outer lead OL4 and the bonding region BR4.

Figure 22:
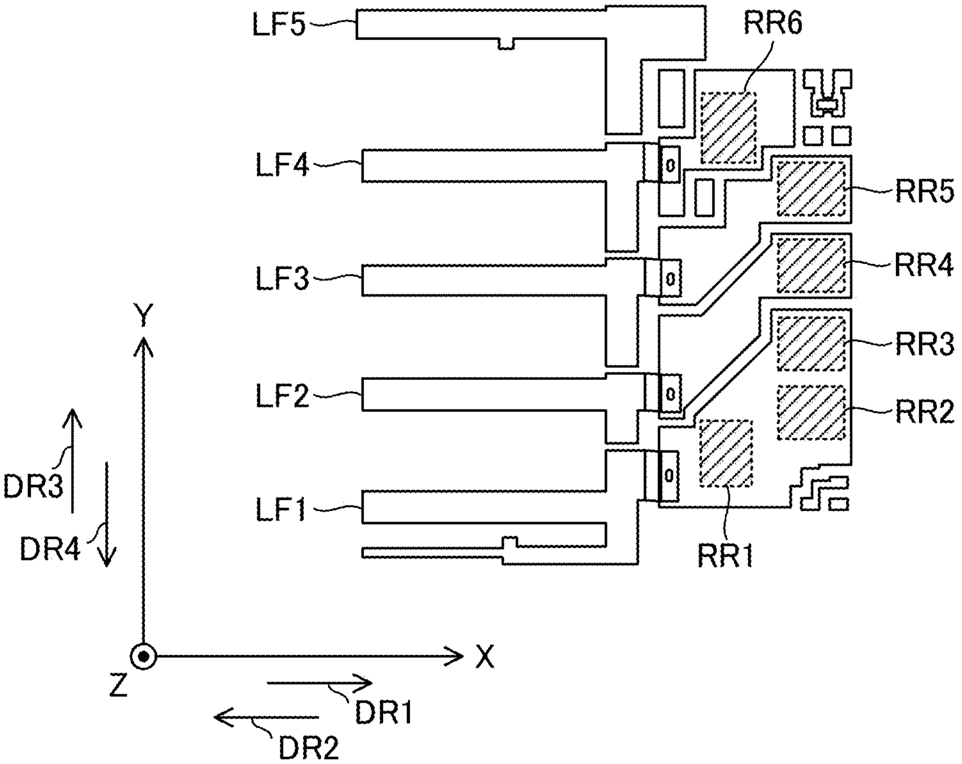
FIG. 22 is a diagram illustrating the six regions defined on the lead frames in FIG. 20 according to an embodiment of the present disclosure.

See FIG. 22. FIG. 22 shows regions RR1 to RR6 as hatched regions. In the six regions RR1 to RR6, six semiconductor elements (Q1 to Q4, D1 and D2) can be disposed, and this will be described in detail later. The regions RR1 to RR3 are three regions within the element mount region ER1 of the lead frame LF1 (see also FIG. 21). The regions RR1 to RR3 are three regions within the element mount region ER1 that are separate from each other. The region RR4 is a region within the element mount region ER2 of the lead frame LF2 (see also FIG. 21). The region RR5 is a region within the element mount region ER3 of the lead frame LF3 (see also FIG. 21). The region RR6 is a region within the element mount region ER4 of the lead frame LF4 (see also FIG. 21).

The regions RR2 to RR5 are disposed side by side along Y-axis. From the negative to the positive side along the Y-axis (i.e., in the direction DR3), the regions RR2 to RR5 are disposed in this order. Thus, along Y-axis, the regions RR2 and RR3 are adjacent to each other, the regions RR3 and RR4 are adjacent to each other, and the regions RR4 and RR5 are adjacent to each other. The region RR1 is disposed at a position displaced in the directions DR2 and DR4 as seen from the region RR2. The region RR6 is disposed at a position displaced in the directions DR2 and DR3 as seen from the region RR5. The regions RR1 and RR6 are disposed side by side along Y-axis. The region RR6 is disposed at a position displaced in the direction DR3 as seen from region RR1. While an example of the positional relationship among the regions RR1 to RR6 has been described above, the positional relationship among the regions RR1 to RR6 can be modified as desired.

Now, by way of a plurality of practical examples, specific examples of the configuration of the power supply device 1 (in particular, the semiconductor device 100) will be described along with applied technologies, modified technologies, and the like. Unless otherwise stated or unless inconsistent, any features described in connection with the embodiment above are applicable to the practical examples described below. For any features of the practical examples that contradict with what has been described above, their description given in connection with the practical examples can prevail. Unless inconsistent, any feature of any of the plurality of practical examples described below is applicable to any other of the practical examples (i.e., two or more of the plurality of practical examples can be implemented in combination).

First Practical Example

Figure 23:
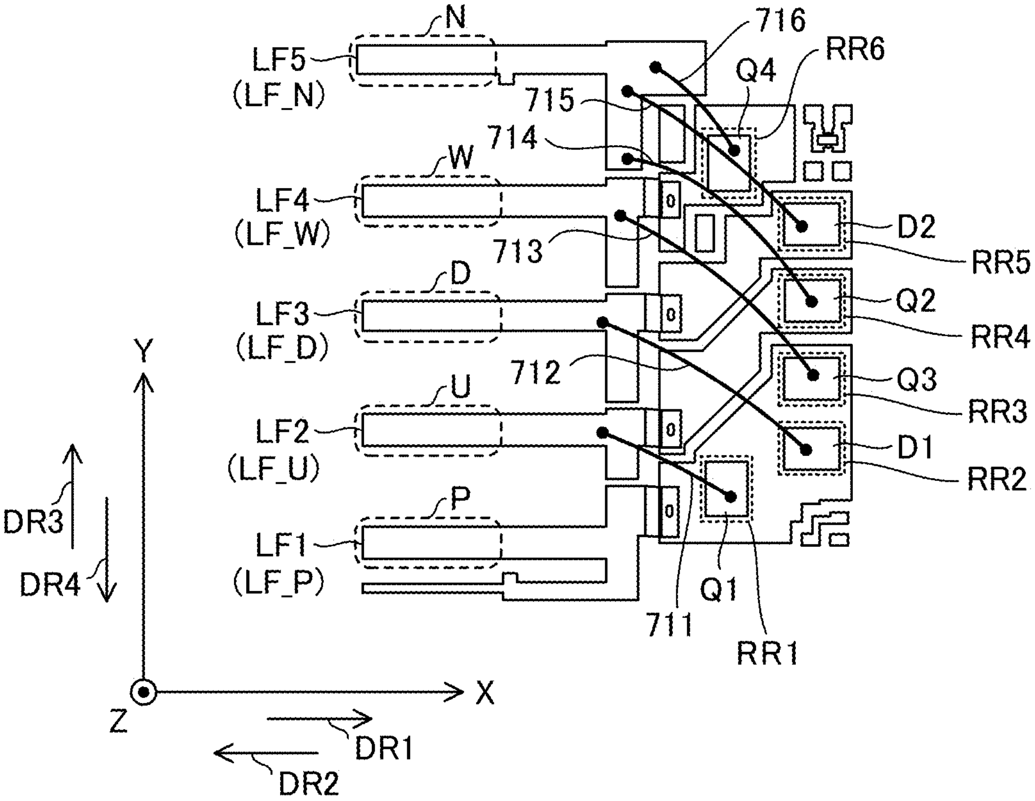
FIG. 23 is a diagram showing the relationship among five lead frames and six semiconductor elements according to a first practical example belonging to an embodiment of the present disclosure.
Figure 24:
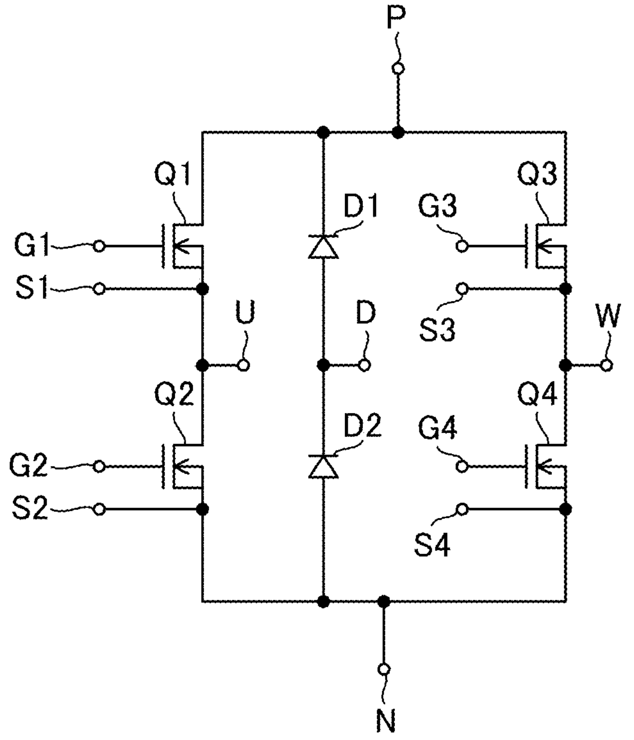
FIG. 24 is a diagram showing the interconnections among the six semiconductor elements according to the first practical example belonging to an embodiment of the present disclosure.

A first practical example will be described. FIG. 23 shows the relationship among lead frames LF1 to LF5 and six semiconductor elements (Q1 to Q4, D1, and D2) according to the first practical example. FIG. 24 shows the interconnections among the six semiconductor elements (Q1 to Q4, D1, and D2) according to the first practical example.

In the first practical example, the lead frames LF1, LF2, LF3, LF4, and LF5 function as the supply lead frame LF_P, the first particular lead frame LF_U, the third particular lead frame LF_D, the second particular lead frame LF_W, and the reference lead frame LF_N respectively. Accordingly, in the first practical example (see FIGS. 21 and 23), the outer lead OL1 of the lead frame LF1 (LF_P) constitutes the supply terminal P, the outer lead OL2 of the lead frame LF2 (LF_U) constitutes the first particular terminal U, the outer lead OL3 of the lead frame LF3 (LF_D) constitutes the third particular terminal D, the outer lead OLA of the lead frame LF4 (LF_W) constitutes the second particular terminal W, and the outer lead OL5 of the lead frame LF5 (LF_N) constitutes the reference terminal N.

In the first practical example, the regions RR1, RR2, RR3, RR4, RR5, and RR6 have disposed in them the transistor Q1, the diode D1, the transistor Q3, the transistor Q2, the diode D2, and the transistor Q4 respectively. Specifically,

- a first semiconductor chip having the transistor Q1 formed in it is mounted in the region RR1,
- a second semiconductor chip having the transistor Q2 formed in it is mounted in the region RR4,
- a third semiconductor chip having the transistor Q3 formed in it is mounted in the region RR3,
- a fourth semiconductor chip having the transistor Q4 formed in it is mounted in the region RR6,
- a fifth semiconductor chip having the diode D1 formed in it is mounted in the region RR2, and
- a sixth semiconductor chip having the diode D2 formed in it is mounted in the region RR5.

Each semiconductor chip has a first face and a second face that face away from each other. The first and second faces are parallel to XY-plane. In each of the first to fourth semiconductor chips, a drain (drain electrode) is formed on the first face and a source (source electrode) is formed on the second face (the same applies to the other practical examples described later). In each of the fifth and sixth semiconductor chips, a cathode (cathode electrode) is formed on the first face and an anode (anode electrode) is formed on the second face (the same applies to the other practical examples described later). For example, the transistors Q1 to Q4 can each be configured as a DMOSFET (double-diffused metal-oxide-semiconductor field-effect transistor).

In the semiconductor device 100 according to the first practical example, necessary electrical connections are achieved by wire bonding using a plurality of wires including wires 711 to 716.

The metal mount surface in the region RR1 of the lead frame LF1 (LF_P) and the drain (drain electrode) of the transistor Q1 are bonded together directly using solder. This results in the supply terminal P and the drain of the transistor Q1 being connected together and conducting to each other. At a position displaced to the positive side along Z-axis from the metal mount surface in the region RR1, the source (source electrode) of the transistor Q1 is formed. The source (source electrode) of the transistor Q1 and the bonding region BR2 of the lead frame LF2 (LF_U) are connected together via the wire 711. This results in the first particular terminal U and the source of the transistor Q1 being connected together and conducting to each other.

The metal mount surface in the region RR2 of the lead frame LF1 (LF_P) and the cathode (cathode electrode) of the diode D1 are bonded together directly using solder. This results in the cathode of the diode D1 and the drain of the transistor Q1 being connected together and conducting to each other and the supply terminal P and the cathode of the diode D1 being connected together and conducting to each other. At a position displaced to the positive side along Z-axis from the metal mount surface in the region RR2, the anode (anode electrode) of the diode D1 is formed. The anode of the diode D1 and the bonding region BR3 of the lead frame LF3 (LF_D) are connected together via the wire 712. This results in the third particular terminal D and the anode of the diode D1 being connected together and conducting to each other.

The metal mount surface in the region RR3 of the lead frame LF1 (LF_P) and the drain (drain electrode) of the transistor Q3 are bonded together directly using solder. This results in the supply terminal P and the drain of the transistor Q3 being connected together and conducting to each other. At a position displaced to the positive side along Z-axis from the metal mount surface in the region RR3, the source (source electrode) of the transistor Q3 is formed. The source (source electrode) of the transistor Q3 and the bonding region BR4 of the lead frame LF4 (LF_W) are connected together via the wire 713. This results in the second particular terminal W and the source of the transistor Q3 being connected together and conducting to each other.

The metal mount surface in the region RR4 of the lead frame LF2 (LF_U) and the drain (drain electrode) of the transistor Q2 are bonded together directly using solder. This results in the first particular terminal U and the drain of the transistor Q2 being connected together and conducting to each other. At a position displaced to the positive side along Z-axis from the metal mount surface in the region RR4, the source (source electrode) of the transistor Q2 is formed. The source (source electrode) of the transistor Q2 and the bonding region BR5 of the lead frame LF5 (LF_N) are connected together via the wire 714. This results in the reference terminal N and the source of the transistor Q2 being connected together and conducting to each other.

The metal mount surface in the region RR5 of the lead frame LF3 (LF_D) and the cathode (cathode electrode) of the diode D2 are bonded together directly using solder. This results in the third particular terminal D and the cathode of the diode D2 being connected together and conducting to each other. At a position displaced to the positive side along Z-axis from the metal mount surface in the region RR5, the anode (anode electrode) of the diode D2 is formed. The anode of the diode D2 and the bonding region BR5 of the lead frame LF5 (LF_N) are connected together via the wire 715. This results in the reference terminal N and the anode of the diode D2 being connected together and conducting to each other and the anode of the diode D2 and the source of the transistor Q2 being connected together and conducting to each other via the wires 715 and 714.

The metal mount surface in the region RR6 of the lead frame LF4 (LF_W) and the drain (drain electrode) of the transistor Q4 are bonded together directly using solder. This results in the second particular terminal W and the drain of the transistor Q4 being connected together and conducting to each other. At a position displaced to the positive side along Z-axis from the metal mount surface in the region RR6, the source (source electrode) of the transistor Q4 is formed. The source (source electrode) of the transistor Q4 and the bonding region BR5 of the lead frame LF5 (LF_N) are connected together via the wire 716. This results in the reference terminal N and the source of the transistor Q4 being connected together and conducting to each other.

Though not specifically illustrated, the gates of the transistors Q1 to Q4 are connected via four gate wires to the inner leads of the first to fourth gate lead frames respectively, and this results in the gates of the transistors Q1 to Q4 being connected to and conducting to the first to fourth gate terminals G1 to G4 respectively (a similar description applies to the second to fourth practical examples described later). Likewise, the sources of the transistors Q1 to Q4 are connected via four source wires to the inner leads of the first to fourth source lead frames respectively, and this results in the sources of the transistors Q1 to Q4 being connected to and conducting to the first to fourth source terminals S1 to S4 respectively (a similar description applies to the second to fourth practical examples described later).

Figure 25:
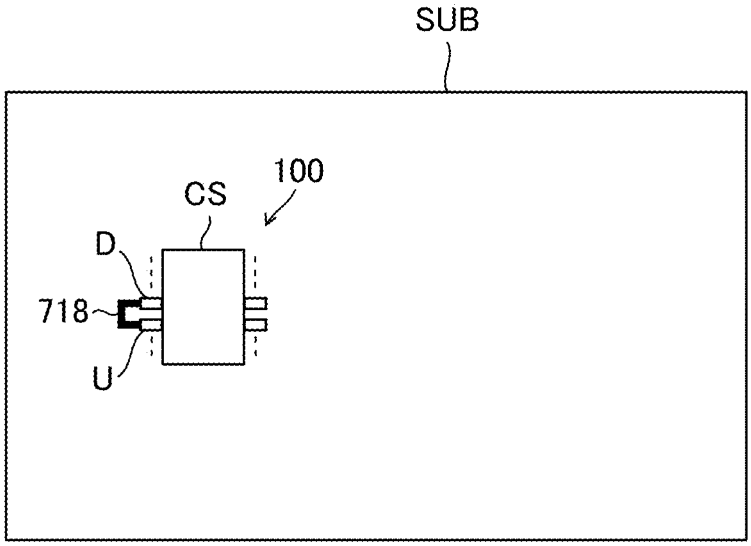
FIG. 25 is a diagram showing how two external terminals are short-circuited together on a target substrate according to the first practical example belonging to an embodiment of the present disclosure.

Two of the external terminals of the semiconductor device 100, namely the particular terminals U and D, are connected together outside the semiconductor device 100. As shown in FIG. 25, the particular terminals U and D can be short-circuited together via a wiring pattern 718 that is formed outside the semiconductor device 100, on the target substrate SUB (FIG. 25 only shows how the particular terminals U and D are short-circuited together). An inductor can be inserted between the particular terminals U and D outside the semiconductor device 100.

As mentioned previously, preferably, the diode D1 is disposed as close as possible to the transistor Q1. From this viewpoint, the transistor Q1 and the diode D1 are disposed adjacent to each other. Specifically, no other semiconductor element (such as any of the transistors Q2 to Q4 and the diode D2) is disposed between the transistor Q1 and the diode D1. Likewise, preferably, the diode D2 is disposed as close as possible to the transistor Q2. From this viewpoint, the transistor Q2 and the diode D2 are disposed adjacent to each other. Specifically, no other semiconductor element (such as any of the transistors Q1, Q3, and Q4 and the diode D1) is disposed between the transistor Q2 and the diode D2.

As will be understood from the foregoing, in the first practical example, the transistor Q1, the transistor Q3, and the diode D1 are disposed on the inner lead of the supply lead frame LF_P (LF1). The transistor Q2 is disposed on the inner lead of the first particular lead frame LF_U (LF2), the transistor Q4 is disposed on the inner lead of the second particular lead frame LF_W (LF4), and the diode D2 is disposed on the inner lead of the third particular lead frame LF_D (LF3). The particular lead frames LF_U, LF_W, and LF_D are disposed between the supply lead frames LF_P and the reference lead frames LF_N (LF5), and the first and third particular lead frames LF_U and LF_D are disposed adjacent to each other. By wire bonding, the transistor Q1 is made to conduct to the first particular lead frame LF_U, the diode D1 is made to conduct to the third particular lead frame LF_D, the transistor Q3 is made to conduct to the second particular lead frame LF_W, and the transistors Q2 and Q4 and the diode D2 are made to conduct to the reference lead frame LF_N.

Here, on the inner lead of the supply lead frame LF_P, the transistor Q1 and the diode D1 are located adjacent to each other. Moreover, the first and third particular lead frames LF_U and LF_D are disposed adjacent to each other so that the transistor Q2 and the diode D2 are located adjacent to each.

Second Practical Example

Figure 26:
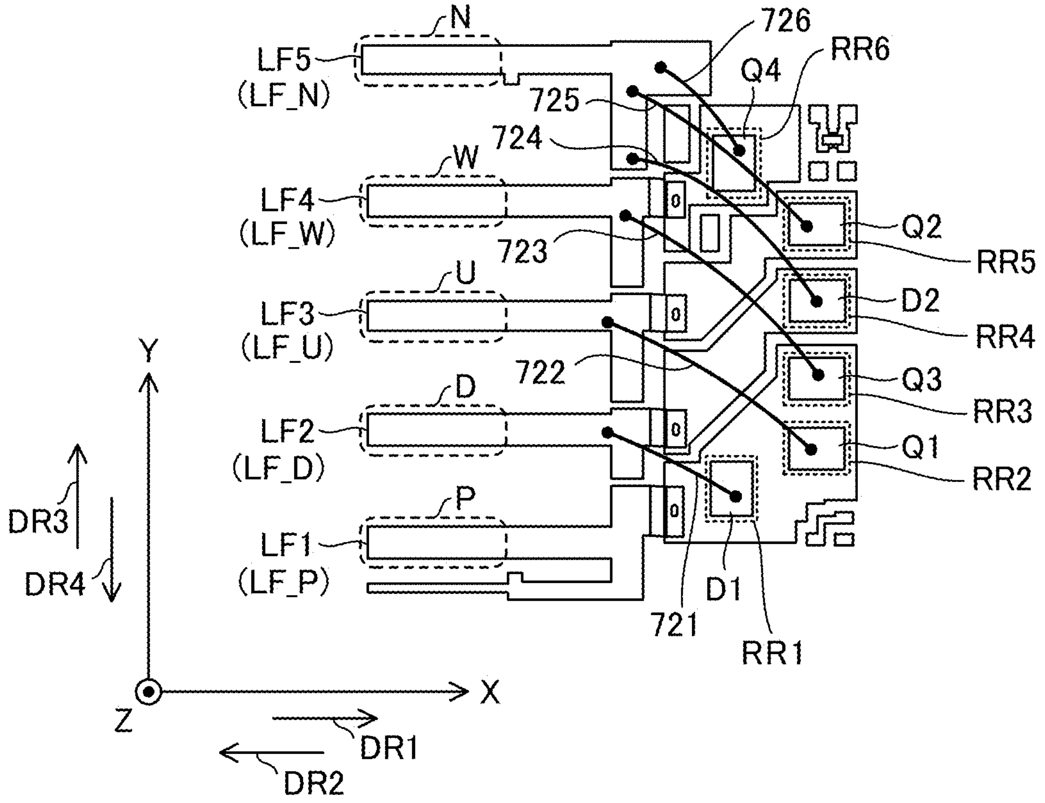
FIG. 26 is a diagram showing the relationship among five lead frames and six semiconductor elements according to a second practical example belonging to an embodiment of the present disclosure.
Figure 27:
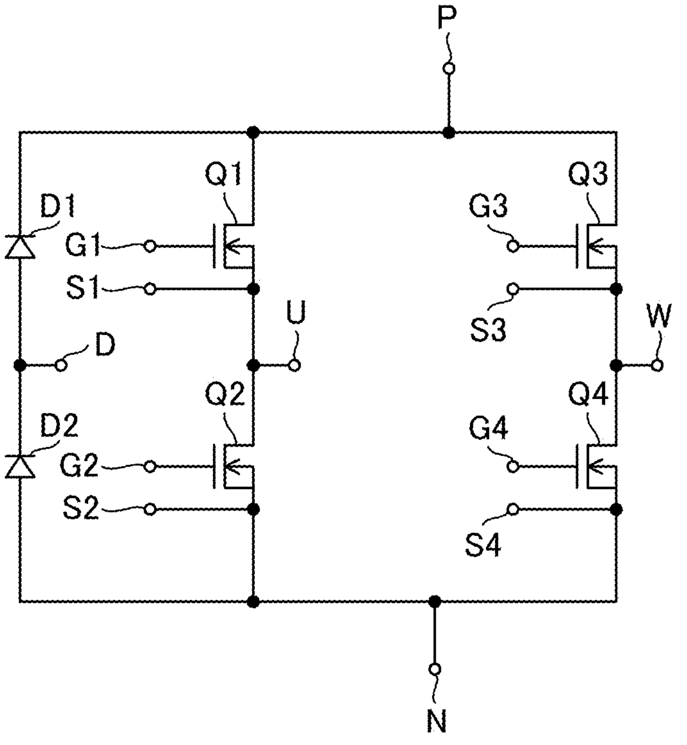
FIG. 27 is a diagram showing the interconnections among the six semiconductor elements according to the second practical example belonging to an embodiment of the present disclosure.

A second practical example will be described. FIG. 26 shows the relationship among lead frames LF1 to LF5 and six semiconductor elements (Q1 to Q4, D1, and D2) according to the second practical example. The second practical example has a configuration where, as compared with the configuration of the first practical example, the transistor Q1 and the diode D1 are disposed at interchanged positions and the transistor Q2 and the diode D2 are disposed at interchanged positions. FIG. 27 shows the interconnections among the six semiconductor elements (Q1 to Q4, D1, and D2) according to the second practical example. The interconnections among the six semiconductor elements (Q1 to Q4, D1, and D2) shown in FIG. 27 are equivalent to the interconnections among the six semiconductor elements (Q1 to Q4, D1, and D2) shown in FIG. 24.

In the second practical example, the lead frames LF1, LF2, LF3, LF4, and LF5 function as the supply lead frame LF_P, the third particular lead frame LF_D, the first particular lead frame LF_U, the second particular lead frame LF_W, and the reference lead frame LF_N respectively. Accordingly, in the second practical example (see FIGS. 21 and 26), the outer lead OL1 of the lead frame LF1 (LF_P) constitutes the supply terminal P, the outer lead OL2 of the lead frame LF2 (LF_D) constitutes the third particular terminal D, the outer lead OL3 of the lead frame LF3 (LF_U) constitutes the first particular terminal U, the outer lead OL4 of the lead frame LF4 (LF_W) constitutes the second particular terminal W, and the outer lead OL5 of the lead frame LF5 (LF_N) constitutes the reference terminal N.

In the second practical example, the regions RR1, RR2, RR3, RR4, RR5, and RR6 have disposed in them the diode D1, the transistor Q1, the transistor Q3, the diode D2, the transistor Q2, and the transistor Q4 respectively. Specifically,

- a first semiconductor chip having the transistor Q1 formed in it is mounted in the region RR2,
- a second semiconductor chip having the transistor Q2 formed in it is mounted in the region RR5,
- a third semiconductor chip having the transistor Q3 formed in it is mounted in the region RR3,
- a fourth semiconductor chip having the transistor Q4 formed in it is mounted in the region RR6,
- a fifth semiconductor chip having the diode D1 formed in it is mounted in the region RR1, and a sixth semiconductor chip having the diode D2 formed in it is mounted in the region RR4.

In the semiconductor device 100 according to the second practical example, necessary electrical connections are achieved by wire bonding using a plurality of wires including wires 721 to 726.

The metal mount surface in the region RR1 of the lead frame LF1 (LF_P) and the cathode (cathode electrode) of the diode D1 are bonded together directly using solder. This results in the supply terminal P and the cathode of the diode D1 being connected together and conducting to each other. At a position displaced to the positive side along Z-axis from the metal mount surface in the region RR1, the anode (anode electrode) of the diode D1 is formed. The anode of the diode D1 and the bonding region BR2 of the lead frame LF2 (LF_D) are connected together via the wire 721. This results in the third particular terminal D and the anode of the diode D1 being connected together and conducting to each other.

The metal mount surface in the region RR2 of the lead frame LF1 (LF_P) and the drain (drain electrode) of the transistor Q1 are bonded together directly using solder. This results in the supply terminal P and the drain (drain electrode) of the transistor Q1 being connected together and conducting to each other and the cathode of the diode D1 and the drain of the transistor Q1 being connected together and conducting to each other. At a position displaced to the positive side along Z-axis from the metal mount surface in the region RR2, the source (source electrode) of the transistor Q1 is formed. The source (source electrode) of the transistor Q1 and the bonding region BR3 of the lead frame LF3 (LF_U) are connected together via the wire 722. This results in the first particular terminal U and the source of the transistor Q1 being connected together and conducting to each other.

The metal mount surface in the region RR3 of the lead frame LF1 (LF_P) and the drain (drain electrode) of the transistor Q3 are bonded together directly using solder. This results in the supply terminal P and the drain of the transistor Q3 being connected together and conducting to each other. At a position displaced to the positive side along Z-axis from the metal mount surface in the region RR3, the source (source electrode) of the transistor Q3 is formed. The source (source electrode) of the transistor Q3 and the bonding region BR4 of the lead frame LF4 (LF_W) are connected together via the wire 723. This results in the second particular terminal W and the source of the transistor Q3 being connected together and conducting to each other.

The metal mount surface in the region RR4 of the lead frame LF2 (LF_D) and the cathode (cathode electrode) of the diode D2 are bonded together directly using solder. This results in the third particular terminal D and the cathode of the diode D2 being connected together and conducting to each other. At a position displaced to the positive side along Z-axis from the metal mount surface in the region RR4, the anode (anode electrode) of the diode D2 is formed. The anode of the diode D2 and the bonding region BR5 of the lead frame LF5 (LF_N) are connected together via the wire 724. This results in the reference terminal N and the anode of the diode D2 being connected together and conducting to each other.

The metal mount surface in the region RR5 of the lead frame LF3 (LF_U) and the drain (drain electrode) of the transistor Q2 are bonded together directly using solder. This results in the first particular terminal U and the drain of the transistor Q2 being connected together and conducting to each other. At a position displaced to the positive side along Z-axis from the metal mount surface in the region RR5, the source (source electrode) of the transistor Q2 is formed. The source (source electrode) of the transistor Q2 and the bonding region BR5 of the lead frame LF5 (LF_N) are connected together via the wire 725. This results in the reference terminal N and the source of the transistor Q2 being connected together and conducting to each other and the source of the transistor Q2 and the anode of the diode D2 being connected together and conducting to each other via the wires 725 and 724.

The metal mount surface in the region RR6 of the lead frame LF4 (LF_W) and the drain (drain electrode) of the transistor Q4 are bonded together directly using solder. This results in the second particular terminal W and the drain of the transistor Q4 being connected together and conducting to each other. At a position displaced to the positive side along Z-axis from the metal mount surface in the region RR6, the source (source electrode) of the transistor Q4 is formed. The source (source electrode) of the transistor Q4 and the bonding region BR5 of the lead frame LF5 (LF_N) are connected together via the wire 726. This results in the reference terminal N and the source of the transistor Q4 being connected together and conducting to each other.

As in the first practical example, also in the second practical example, the particular terminals U and D are connected together outside the semiconductor device 100. For example, as shown in FIG. 25, the particular terminals U and D can be short-circuited together via a wiring pattern 718 that is formed outside the semiconductor device 100, on the target substrate SUB. An inductor can be inserted between the particular terminals U and D outside the semiconductor device 100.

As mentioned previously, preferably, the diode D1 is disposed as close as possible to the transistor Q1. From this viewpoint, the transistor Q1 and the diode D1 are disposed adjacent to each other. Specifically, no other semiconductor element (such as any of the transistors Q2 to Q4 and the diode D2) is disposed between the transistor Q1 and the diode D1. Likewise, preferably, the diode D2 is disposed as close as possible to the transistor Q2. From this viewpoint, the transistor Q2 and the diode D2 are disposed adjacent to each other. Specifically, no other semiconductor element (such as any of the transistors Q1, Q3, and Q4 and the diode D1) is disposed between the transistor Q2 and the diode D2.

As will be understood from the foregoing, in the second practical example, the transistor Q1, the transistor Q3, and the diode D1 are disposed on the inner lead of the supply lead frame LF_P (LF1). The transistor Q2 is disposed on the inner lead of the first particular lead frame LF_U (LF3), the transistor Q4 is disposed on the inner lead of the second particular lead frame LF_W (LF4), and the diode D2 is disposed on the inner lead of the third particular lead frame LF_D (LF2). The particular lead frames LF_U, LF_W, and LF_D are disposed between the supply lead frames LF_P and the reference lead frames LF_N (LF5), and the first and third particular lead frames LF_U and LF_D are disposed adjacent to each other. By wire bonding, the transistor Q1 is made to conduct to the first particular lead frame LF_U, the diode D1 is made to conduct to the third particular lead frame LF_D, the transistor Q3 is made to conduct to the second particular lead frame LF_W, and the transistors Q2 and Q4 and the diode D2 are made to conduct to the reference lead frame LF_N.

Here, on the inner lead of the supply lead frame LF_P, the transistor Q1 and the diode D1 are located adjacent to each other. Moreover, the first and third particular lead frames LF_U and LF_D are disposed adjacent to each other so that the transistor Q2 and the diode D2 are located adjacent to each.

Third Practical Example

Figure 28:
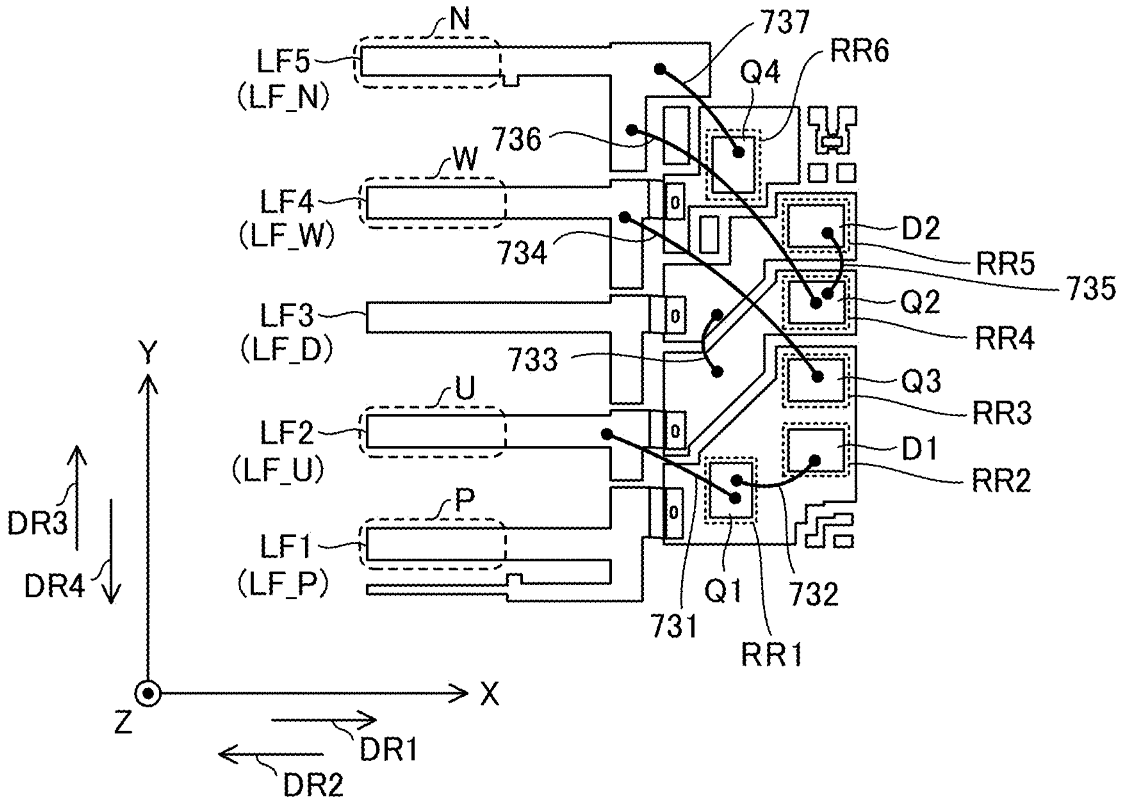
FIG. 28 is a diagram showing the relationship among five lead frames and six semiconductor elements according to a third practical example belonging to an embodiment of the present disclosure.
Figure 29:
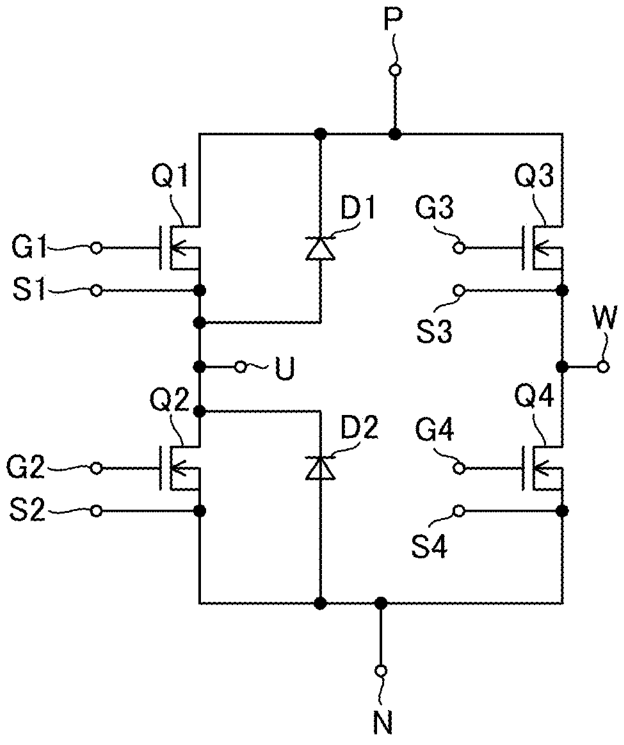

A third practical example will be described. FIG. 28 shows the relationship among lead frames LF1 to LF5 and six semiconductor elements (Q1 to Q4, D1, and D2) according to the third practical example. FIG. 29 shows the interconnections among the six semiconductor elements (Q1 to Q4, D1, and D2) according to the third practical example.

In the third practical example, the lead frames LF1, LF2, LF3, LF4, and LF5 function as the supply lead frame LF_P, the first particular lead frame LF_U, the third particular lead frame LF_D, the second particular lead frame LF_W, and the reference lead frame LF_N respectively. In the third practical example (see FIGS. 21 and 28), the outer lead OL1 of the lead frame LF1 (LF_P) constitutes the supply terminal P, the outer lead OL2 of the lead frame LF2 (LF_U) constitutes the first particular terminal U, the outer lead OLA of the lead frame LF4 (LF_W) constitutes the second particular terminal W, and the outer lead OL5 of the lead frame LF5 (LF_N) constitutes the reference terminal N. In the third practical example, the semiconductor device 100 has no third practical terminal D as an external terminal. Instead, the outer lead OL3 of the lead frame LF3 (LF_D) can be made to function as a third practical terminal D so that the semiconductor device 100 has a third practical terminal D. In that case, either the particular terminals U and D are short-circuited together on the target substrate SUB (see FIG. 25) or the particular terminal D is left open on the target substrate SUB.

In the third practical example, the regions RR1, RR2, RR3, RR4, RR5, and RR6 have disposed in them the transistor Q1, the diode D1, the transistor Q3, the transistor Q2, the diode D2, and the transistor Q4 respectively. Specifically,

- a first semiconductor chip having the transistor Q1 formed in it is mounted in the region RR1,
- a second semiconductor chip having the transistor Q2 formed in it is mounted in the region RR4,
- a third semiconductor chip having the transistor Q3 formed in it is mounted in the region RR3,
- a fourth semiconductor chip having the transistor Q4 formed in it is mounted in the region RR6,
- a fifth semiconductor chip having the diode D1 formed in it is mounted in the region RR2, and
- a sixth semiconductor chip having the diode D2 formed in it is mounted in the region RR5.

In the semiconductor device 100 according to the third practical example, necessary electrical connections are achieved by wire bonding using a plurality of wires including wires 731 to 737.

The metal mount surface in the region RR1 of the lead frame LF1 (LF_P) and the drain (drain electrode) of the transistor Q1 are bonded together directly using solder. This results in the supply terminal P and the drain of the transistor Q1 being connected together and conducting to each other. At a position displaced to the positive side along Z-axis from the metal mount surface in the region RR1, the source (source electrode) of the transistor Q1 is formed. The source (source electrode) of the transistor Q1 and the bonding region BR2 of the lead frame LF2 (LF_U) are connected together via the wire 731. This results in the first particular terminal U and the source of the transistor Q1 being connected together and conducting to each other.

The metal mount surface in the region RR2 of the lead frame LF1 (LF_P) and the cathode (cathode electrode) of the diode D1 are bonded together directly using solder. This results in the supply terminal P, the drain of the transistor Q1, and the cathode of the diode D1 being connected together and conducting to each other. At a position displaced to the positive side along Z-axis from the metal mount surface in the region RR2, the anode (anode electrode) of the diode D1 is formed. The anode of the diode D1 and the source of the transistor Q1 are connected together directly via the wire 732 inside the semiconductor device 100, with no lead frame along the way. As a result, the anode of the diode D1 is connected to the first particular terminal U via the wires 732 and 731.

The metal mount surface in the region RR3 of the lead frame LF1 (LF_P) and the drain (drain electrode) of the transistor Q3 are bonded together directly using solder. This results in the supply terminal P and the drain of the transistor Q3 being connected together and conducting to each other. At a position displaced to the positive side along Z-axis from the metal mount surface in the region RR3, the source (source electrode) of the transistor Q3 is formed. The source (source electrode) of the transistor Q3 and the bonding region BR4 of the lead frame LF4 (LF_W) are connected together via the wire 734. This results in the second particular terminal W and the source of the transistor Q3 being connected together and conducting to each other.

The metal mount surface in the region RR4 of the lead frame LF2 (LF_U) and the drain (drain electrode) of the transistor Q2 are bonded together directly using solder. This results in the first particular terminal U and the drain of the transistor Q2 being connected together and conducting to each other. At a position displaced to the positive side along Z-axis from the metal mount surface in the region RR4, the source (source electrode) of the transistor Q2 is formed. The source (source electrode) of the transistor Q2 and the bonding region BR5 of the lead frame LF5 (LF_N) are connected together via the wire 736. This results in the reference terminal N and the source of the transistor Q2 being connected together and conducting to each other.

The metal mount surface in the region RR5 of the lead frame LF3 (LF_D) and the cathode (cathode electrode) of the diode D2 are bonded together directly using solder. Moreover, inside the semiconductor device 100, the inner lead of the lead frame LF2 and the inner lead of the lead frame LF3 are connected together via the wire 733 and conduct to each other. Thus, inside the semiconductor device 100, the cathode of the diode D2 is connected to and conducts to the drain of the transistor Q2 via the inner lead of the lead frame LF3, the wire 733, and the inner lead of the lead frame LF2. The anode of the diode D2 and the source of the transistor Q2 are connected together directly via the wire 735 inside the semiconductor device 100, with no lead frame along the way. As a result, the anode of the diode D2 is connected to the reference terminal N via the wires 735 and 736.

The metal mount surface in the region RR6 of the lead frame LF4 (LF_W) and the drain (drain electrode) of the transistor Q4 are bonded together directly using solder. This results in the second particular terminal W and the drain of the transistor Q4 being connected together and conducting to each other. At a position displaced to the positive side along Z-axis from the metal mount surface in the region RR6, the source (source electrode) of the transistor Q4 is formed. The source (source electrode) of the transistor Q4 and the bonding region BR5 of the lead frame LF5 (LF_N) are connected together via the wire 737. This results in the reference terminal N and the source of the transistor Q4 being connected together and conducting to each other.

As mentioned previously, preferably, the diode D1 is disposed as close as possible to the transistor Q1. From this viewpoint, the transistor Q1 and the diode D1 are disposed adjacent to each other. Specifically, no other semiconductor element (such as any of the transistors Q2 to Q4 and the diode D2) is disposed between the transistor Q1 and the diode D1. Likewise, preferably, the diode D2 is disposed as close as possible to the transistor Q2. From this viewpoint, the transistor Q2 and the diode D2 are disposed adjacent to each other. Specifically, no other semiconductor element (such as any of the transistors Q1, Q3, and Q4 and the diode D1) is disposed between the transistor Q2 and the diode D2.

As will be understood from the foregoing, in the third practical example, the transistor Q1, the transistor Q3, and the diode D1 are disposed on the inner lead of the supply lead frame LF_P (LF1). The transistor Q2 is disposed on the inner lead of the first particular lead frame LF_U (LF2), the transistor Q4 is disposed on the inner lead of the second particular lead frame LF_W (LF4), and the diode D2 is disposed on the inner lead of the third particular lead frame LF_D (LF3). The particular lead frames LF_U, LF_W, and LF_D are disposed between the supply lead frames LF_P and the reference lead frames LF_N (LF5), and here the first and third particular lead frames LF_U and LF_D are disposed adjacent to each other. By wire bonding, the transistor Q1 is made to conduct to the first particular lead frame LF_U, the transistor Q3 is made to conduct to the second particular lead frame LF_W, and the transistors Q2 and Q4 and the diode D2 are made to conduct to the reference lead frame LF_N. Moreover, the transistor Q1 and the diode D1 are connected in parallel with each other by use of the inner lead of the supply lead frame LF_P and a first wire (732) that connects directly between the transistor Q1 and the diode D1 inside the package CS. The transistor Q2 and the diode D2 are connected in parallel with each other by use of a second wire (733) that connects directly between the inner lead of the first particular lead frame LF_U and the inner lead of the third particular lead frame LF_D inside the package CS and a third wire (735) that connects directly between the transistor Q2 and the diode D2 inside the package CS.

Here, on the inner lead of the supply lead frame LF_P, the transistor Q1 and the diode D1 are located adjacent to each other. Moreover, the first and third particular lead frames LF_U and LF_D are disposed adjacent to each other so that the transistor Q2 and the diode D2 are located adjacent to each.

Fourth Practical Example

Figure 30:
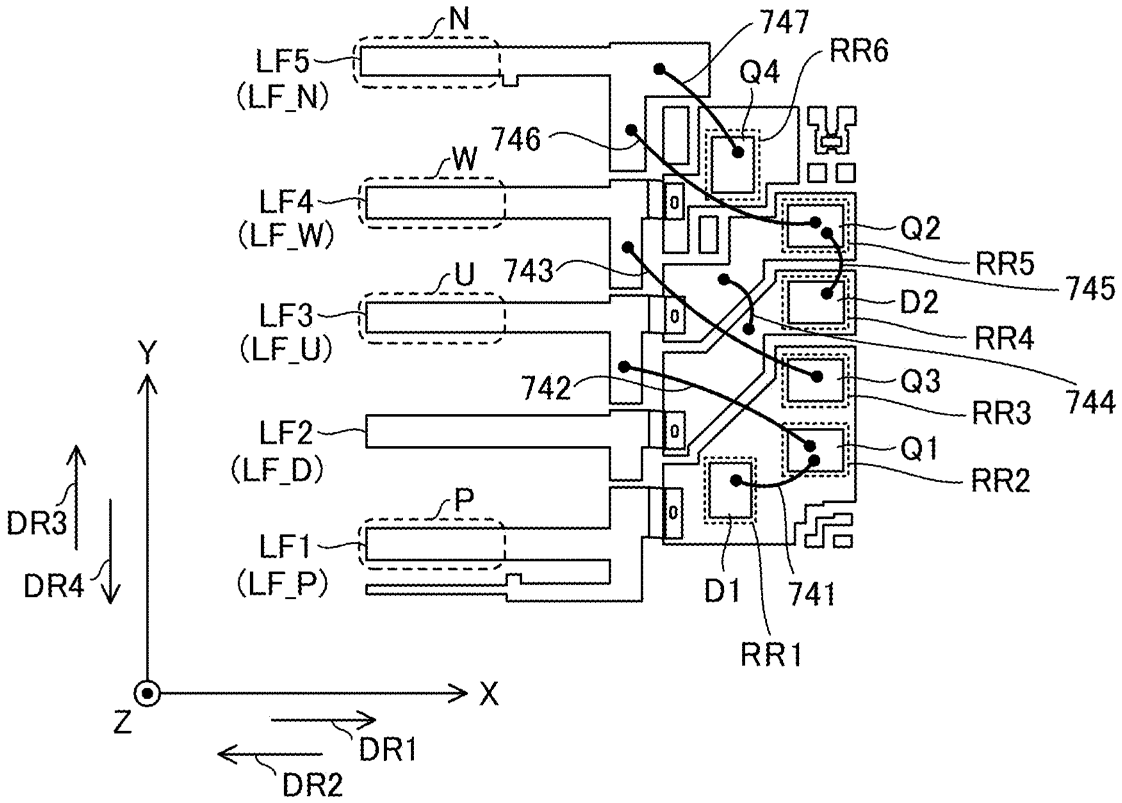
FIG. 30 is a diagram showing the relationship among five lead frames and six semiconductor elements according to a fourth practical example belonging to an embodiment of the present disclosure.
Figure 31:
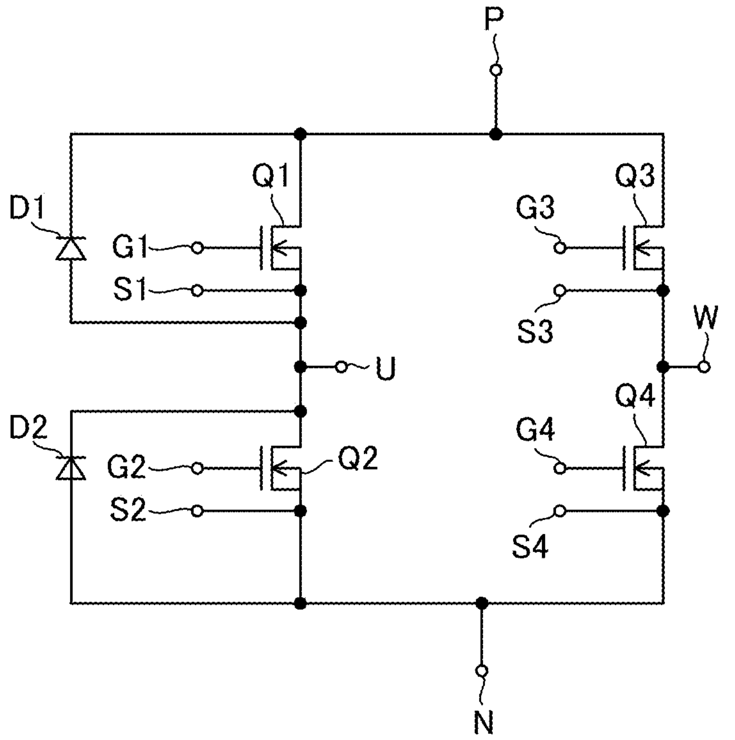
FIG. 31 is a diagram showing the interconnections among the six semiconductor elements according to the fourth practical example belonging to an embodiment of the present disclosure.

A fourth practical example will be described. FIG. 30 shows the relationship among lead frames LF1 to LF5 and six semiconductor elements (Q1 to Q4, D1, and D2) according to the fourth practical example. The fourth practical example has a configuration where, as compared with the configuration of the third practical example, the transistor Q1 and the diode D1 are disposed at interchanged positions and the transistor Q2 and the diode D2 are disposed at interchanged positions. FIG. 31 shows the interconnections among the six semiconductor elements (Q1 to Q4, D1, and D2) according to the fourth practical example. The interconnections among the six semiconductor elements (Q1 to Q4, D1, and D2) shown in FIG. 31 are equivalent to the interconnections among the six semiconductor elements (Q1 to Q4, D1, and D2) shown in FIG. 29.

In the fourth practical example, the lead frames LF1, LF2, LF3, LF4, and LF5 function as the supply lead frame LF_P, the third particular lead frame LF_D, the first particular lead frame LF_U, the second particular lead frame LF_W, and the reference lead frame LF_N respectively. In the fourth practical example (see FIGS. 21 and 30), the outer lead OL1 of the lead frame LF1 (LF_P) constitutes the supply terminal P, the outer lead OL3 of the lead frame LF3 (LF_U) constitutes the first particular terminal U, the outer lead OLA of the lead frame LF4 (LF_W) constitutes the second particular terminal W, and the outer lead OL5 of the lead frame LF5 (LF_N) constitutes the reference terminal N. In the fourth practical example, the semiconductor device 100 has no third practical terminal D as an external terminal. Instead, the outer lead OL2 of the lead frame LF2 (LF_D) can be made to function as a third practical terminal D so that the semiconductor device 100 has a third practical terminal D. In that case, either the particular terminals U and D are short-circuited together on the target substrate SUB (see FIG. 25) or the particular terminal D is left open on the target substrate SUB.

In the fourth practical example, the regions RR1, RR2, RR3, RR4, RR5, and RR6 have disposed in them the diode D1, the transistor Q1, the transistor Q3, the diode D2, the transistor Q2, and the transistor Q4 respectively. Specifically,

- a first semiconductor chip having the transistor Q1 formed in it is mounted in the region RR2,
- a second semiconductor chip having the transistor Q2 formed in it is mounted in the region RR5,
- a third semiconductor chip having the transistor Q3 formed in it is mounted in the region RR3,
- a fourth semiconductor chip having the transistor Q4 formed in it is mounted in the region RR6,
- a fifth semiconductor chip having the diode D1 formed in it is mounted in the region RR1, and
- a sixth semiconductor chip having the diode D2 formed in it is mounted in the region RR4.

In the semiconductor device 100 according to the fourth practical example, necessary electrical connections are achieved by wire bonding using a plurality of wires including wires 741 to 747.

The metal mount surface in the region RR2 of the lead frame LF1 (LF_P) and the drain (drain electrode) of the transistor Q1 are bonded together directly using solder. This results in the supply terminal P and the drain (drain electrode) of the transistor Q1 being connected together and conducting to each other. At a position displaced to the positive side along Z-axis from the metal mount surface in the region RR2, the source (source electrode) of the transistor Q1 is formed. The source (source electrode) of the transistor Q1 and the bonding region BR3 of the lead frame LF3 (LF_U) are connected together via the wire 742. This results in the first particular terminal U and the source of the transistor Q1 being connected together and conducting to each other.

The metal mount surface in the region RR1 of the lead frame LF1 (LF_P) and the cathode (cathode electrode) of the diode D1 are bonded together directly using solder. This results in the supply terminal P, the drain of the transistor Q1, and the cathode of the diode D1 being connected together and conducting to each other. At a position displaced to the positive side along Z-axis from the metal mount surface in the region RR1, the anode (anode electrode) of the diode D1 is formed. The anode of the diode D1 and the source of the transistor Q1 are connected together directly via the wire 741 inside the semiconductor device

100, with no lead frame along the way. As a result, the anode of the diode D1 is connected to the first particular terminal U via the wires 741 and 742.

The metal mount surface in the region RR3 of the lead frame LF1 (LF_P) and the drain (drain electrode) of the transistor Q3 are bonded together directly using solder. This results in the supply terminal P and the drain of the transistor Q3 being connected together and conducting to each other. At a position displaced to the positive side along Z-axis from the metal mount surface in the region RR3, the source (source electrode) of the transistor Q3 is formed. The source (source electrode) of the transistor Q3 and the bonding region BR4 of the lead frame LF4 (LF_W) are connected together via the wire 743. This results in the second particular terminal W and the source of the transistor Q3 being connected together and conducting to each other.

The metal mount surface in the region RR5 of the lead frame LF3 (LF_U) and the drain (drain electrode) of the transistor Q2 are bonded together directly using solder. This results in the first particular terminal U and the drain of the transistor Q2 being connected together and conducting to each other. At a position displaced to the positive side along Z-axis from the metal mount surface in the region RR5, the source (source electrode) of the transistor Q2 is formed. The source (source electrode) of the transistor Q2 and the bonding region BR5 of the lead frame LF5 (LF_N) are connected together via the wire 746. This results in the reference terminal N and the source of the transistor Q2 being connected together and conducting to each other.

The metal mount surface in the region RR4 of the lead frame LF2 (LF_D) and the cathode (cathode electrode) of the diode D2 are bonded together directly using solder. Moreover, inside the semiconductor device 100, the inner lead of the lead frame LF2 and the inner lead of the lead frame LF3 are connected together via the wire 744 and conduct to each other. Thus, inside the semiconductor device 100, the cathode of the diode D2 is connected to and conducts to the drain of the transistor Q2 via the inner lead of the lead frame LF2, the wire 744, and the inner lead of the lead frame LF3. At a position displaced to the positive side along Z-axis from the metal mount surface in the region RR4, the anode (anode electrode) of the diode D2 is formed. The anode of the diode D2 and the source of the transistor Q2 are connected together directly via the wire 745 inside the semiconductor device 100, with no lead frame along the way. As a result, the anode of the diode D2 is connected to the reference terminal N via the wires 745 and 746.

The metal mount surface in the region RR6 of the lead frame LF4 (LF_W) and the drain (drain electrode) of the transistor Q4 are bonded together directly using solder. This results in the second particular terminal W and the drain of the transistor Q4 being connected together and conducting to each other. At a position displaced to the positive side along Z-axis from the metal mount surface in the region RR6, the source (source electrode) of the transistor Q4 is formed. The source (source electrode) of the transistor Q4 and the bonding region BR5 of the lead frame LF5 (LF_N) are connected together via the wire 747. This results in the reference terminal N and the source of the transistor Q4 being connected together and conducting to each other.

As mentioned previously, preferably, the diode D1 is disposed as close as possible to the transistor Q1. From this viewpoint, the transistor Q1 and the diode D1 are disposed adjacent to each other. Specifically, no other semiconductor element (such as any of the transistors Q2 to Q4 and the diode D2) is disposed between the transistor Q1 and the diode D1. Likewise, preferably, the diode D2 is disposed as close as possible to the transistor Q2. From this viewpoint, the transistor Q2 and the diode D2 are disposed adjacent to each other. Specifically, no other semiconductor element (such as any of the transistors Q1, Q3, and Q4 and the diode D1) is disposed between the transistor Q2 and the diode D2.

As will be understood from the foregoing, in the fourth practical example, the transistor Q1, the transistor Q3, and the diode D1 are disposed on the inner lead of the supply lead frame LF_P (LF1). The transistor Q2 is disposed on the inner lead of the first particular lead frame LF_U (LF3), the transistor Q4 is disposed on the inner lead of the second particular lead frame LF_W (LF4), and the diode D2 is disposed on the inner lead of the third particular lead frame LF_D (LF2). The particular lead frames LF_U, LF_W, and LF_D are disposed between the supply lead frames LF_P and the reference lead frames LF_N (LF5), and here the first and third particular lead frames LF_U and LF_D are disposed adjacent to each other. By wire bonding, the transistor Q1 is made to conduct to the first particular lead frame LF_U, the transistor Q3 is made to conduct to the second particular lead frame LF_W, and the transistors Q2 and Q4 and the diode D2 are made to conduct to the reference lead frame LF_N. Moreover, the transistor Q1 and the diode D1 are connected in parallel with each other by use of the inner lead of the supply lead frame LF_P and a first wire (741) that connects directly between the transistor Q1 and the diode D1 inside the package CS. The transistor Q2 and the diode D2 are connected in parallel with each other by use of a second wire (744) that connects directly between the inner lead of the first particular lead frame LF_U and the inner lead of the third particular lead frame LF_D inside the package CS and a third wire (745) that connects directly between the transistor Q2 and the diode D2 inside the package CS.

Here, on the inner lead of the supply lead frame LF_P, the transistor Q1 and the diode D1 are located adjacent to each other. Moreover, the first and third particular lead frames LF_U and LF_D are disposed adjacent to each other so that the transistor Q2 and the diode D2 are located adjacent to each.

Fifth Practical Example

A fifth practical example will be described. The fifth practical example deals with, in connection with what has been described above, additional features, applied technologies, or modified technologies.

The power supply device 1 is suitable for vehicle onboard applications. Specifically, the power supply device 1 can be incorporated in a vehicle (unillustrated) such as an automobile. The vehicle includes, in addition to the power supply device 1, an engine (unillustrated) for generating motive power to drive the vehicle to run, a battery (unillustrated) comprising secondary cells, and the like. The engine can be an internal combustion engine, a motor, or the like. The battery mounted on the vehicle can be used as the voltage source VS. The power supply device 1, however, is not limited for vehicle onboard applications; it may be employed in any applications (e.g., in DC/DC converters for servers).

The PSFB circuit carries out ZVS operation by use of a resonant inductor. The leakage inductance of the transformer TR can be used as the resonant inductor. The operating range in which ZVS operation is carried out can be broadened by providing the power supply device 1 with a series-added inductor Ls as shown in FIG. 1. The series-added inductor Ls, however, is not essential to the power supply device 1. That is, the series-added inductor Ls can be omitted from the power supply device 1. In that case, the terminal U can be connected directly to the first terminal W1*a* of the primary winding W1 of the transformer TR.

The channel type of any of the FETs (field-effect transistors) described in connection with the embodiment is merely illustrative: unless inconsistent with what has been described above, the channel type of any FET can be modified between a P-channel type and an N-channel type.

Unless incompatible, any transistor mentioned above can be a transistor of any type. For example, unless incompatible, any transistor mentioned above as a MOSFET can be replaced with a junction FET, IGBT (insulated-gate bipolar transistor), or bipolar transistor. Any transistor has a first electrode, a second electrode, and a control electrode. In an FET, of the first and second electrodes one is the drain and the other is the source, and the control electrode is the gate. In an IGBT, of the first and second electrodes one is the collector and the other is the emitter, and the control electrode is the gate. In a bipolar transistor that is not classified as an IGBT, of the first and second electrodes one is the collector and the other is the emitter, and the control electrode is the base.

Embodiments of the present disclosure allow for any modifications as necessary within the scope of technical ideas recited in the appended claims. The embodiments described above are merely examples of implementing the present disclosure, and what is meant by any of the terms used to describe what is disclosed herein and the components of it is not limited to that mentioned in connection with the embodiments. The specific values mentioned in the above description are merely illustrative and needless to say can be modified to different values.

Notes

To follow are notes on the present disclosure of which specific examples of implementation have been described above by way of embodiments.

According to one aspect of the present disclosure, a switching device includes: a reference terminal (N); a supply terminal (P) configured to be fed with a supply voltage (Vp) with a potential higher than the potential at the reference terminal; a first transistor (Q1) configured to be inserted between the supply terminal and the first terminal of the primary winding (W1) of a transformer; a second transistor (Q2) configured to be inserted between the reference terminal and the first terminal of the primary winding; a third transistor (Q3) configured to be inserted between the supply terminal and the second terminal of the primary winding; a fourth transistor (Q4) configured to be inserted between the reference terminal and the second terminal of the primary winding; a first diode (D1) configured to be connected in parallel with the first transistor; and a second diode (D2) configured to be connected in parallel with the second transistor. The first and second diodes have their forward direction pointing from the reference terminal to the supply terminal. (A first configuration.)

Providing the first and second diodes helps improve the recovery characteristics of the first and second transistors. It is thus possible to suppress undesirable behavior associated with the recovery characteristics and to stabilize the operation of the device.

In the switching device of the first configuration described above, the first to fourth transistors can constitute a phase-shift full-bridge circuit. The first and second transistors can be connected in series with each other to constitute the leading leg (Lg1) in the phase-shift full-bridge circuit, and the third and fourth transistors can be connected in series with each other to constitute the lagging leg (Lg2) in the phase-shift full-bridge circuit. (A second configuration.)

In the switching device of the second configuration described above, in the phase-shift full-bridge circuit, of the first to fourth transistors, only the first and second transistors can each have a diode (D1, D2) connected in parallel with it. (A third configuration.)

In a phase-shift full-bridge circuit, undesirable behavior associated with the recovery characteristics is likely in the leading leg. Connecting diodes in parallel only with the first and second transistors respectively helps suppress such undesirable behavior without an undue increase in the number of elements.

The switching device of any of the first to third configurations described above can further include: a package (CS) that houses the first to fourth transistors and the first and second diodes; and a plurality of external terminals that are exposed out of the package and that includes the reference terminal and the supply terminal. (A fourth configuration.)

This helps save space as compared with preparing the first to fourth transistors and the first and second diodes as discrete components.

The switching device of the fourth configuration described above (see FIG. 23 or 26) can further include: a supply lead frame (LF_P), a reference lead frame (LF_N), a first lead frame (LF_U), a second lead frame (LF_W), and a third lead frame (LF_D). Each of the lead frames can have an outer lead exposed out of the package and an inner lead located inside the package. The plurality of external terminals can include, in addition to the reference terminal and the supply terminal, a first external terminal (U), a second external terminal (W), and a third external terminal (D) configured to be connected to the first external terminal. The outer leads of the supply lead frame and the reference lead frame can constitute the supply terminal and the reference terminal respectively. The outer leads of the first, second, and third lead frames can constitute the first, second, and third external terminals respectively. The first transistor, the third transistor, and the first diode can be disposed on the inner lead of the supply lead frame. The second transistor, the fourth transistor, and the second diode can be disposed on the inner leads of the first, second, and third lead frames respectively. The first to third lead frames can be disposed between the supply lead frame and the reference lead frame. The first and third lead frames can be disposed adjacent to each other. By wire bonding, the first transistor can be made to conduct to the first lead frame, the first diode can be made to conduct to the third lead frame, the third transistor can be made to conduct to the second lead frame, and the second transistor, the fourth transistor, and the second diode can be made to conduct to the reference lead frame. (A fifth configuration.)

In this way, the first diode can be located close to the first transistor, and this enhances the effect of the provision of the first diode. Likewise, the second diode can be located close to the second transistor, and this enhances the effect of the provision of the second diode.

In the switching device of the fifth configuration described above (see FIG. 23 or 26), on the inner lead of the supply lead frame, the first transistor and the first diode can be located adjacent to each other, and the first and third lead frames can be disposed adjacent to each other such that the second transistor and the second diode are located adjacent to each other. (A sixth configuration.)

It is thus possible to enhance the effect of the provision of the first and second diodes.

The switching device of the fourth configuration described above (see FIG. 28 or 30) can further include: a supply lead frame (LF_P), a reference lead frame (LF_N), a first lead frame (LF_U), a second lead frame (LF_W), and a third lead frame (LF_D). Each of the lead frames can have an outer lead exposed out of the package and an inner lead located inside the package. The plurality of external terminals can include, in addition to the reference terminal and the supply terminal, a first external terminal (U) and a second external terminal (W). The outer leads of the supply lead frame and the reference lead frame can constitute the supply terminal and the reference terminal respectively. The outer leads of the first and second lead frames can constitute the first and second external terminals respectively. The first transistor, the third transistor, and the first diode can be disposed on the inner lead of the supply lead frame. The second transistor, the fourth transistor, and the second diode can be disposed on the inner leads of the first, second, and the third lead frames respectively. The first to third lead frames can be disposed between the supply lead frame and the reference lead frame. The first and third lead frames are disposed adjacent to each other. By wire bonding, the first transistor can be made to conduct to the first lead frame, the third transistor can be made to conduct to the second lead frame, and the second transistor, the fourth transistor, and the second diode can be made to conduct to the reference lead frame. The first transistor and the first diode can be connected in parallel with each other by use of the inner lead of the supply lead frame and a first wire (e.g., the wire 732 in FIG. 28) that connects directly between the first transistor and the first diode inside the package. The second transistor and the second diode can be connected in parallel with each other by use of a second wire (e.g., the wire 733 in FIG. 28) that connects directly between the inner lead of the first lead frame and the inner lead of the third lead frame inside the package and a third wire (e.g., the wire 735 in FIG. 28) that connects directly between the second transistor and the second diode inside the package. (A seventh configuration.)

In this way, the first diode can be located close to the first transistor, and this enhances the effect of the provision of the first diode. Likewise, the second diode can be located close to the second transistor, and this enhances the effect of the provision of the second diode.

In the switching device of the seventh configuration described above (see FIG. 28 or 30), on the inner lead of the supply lead frame, the first transistor and the first diode can be located adjacent to each other, and the first and third lead frames can be disposed adjacent to each other such that the second transistor and the second diode are located adjacent to each other. (An eighth configuration.)

It is thus possible to enhance the effect of the provision of the first and second diodes.

In the switching device of any of the first to eighth configurations described above, the first to fourth transistors can each be a MOSFET. (A ninth configuration.)

In the switching device of the ninth configuration described above, the first to fourth transistors can each be a MOSFET formed using SiC. (A tenth configuration.)

This makes it easy to carry out zero-voltage switching operation in the switching device.

In the switching device of any of the first to tenth configurations described above, the first and second diodes can each be a Shottky barrier diode formed using SiC. (An eleventh configuration.)

In this way, it is possible to greatly improve the recovery characteristics associated with the first and second transistors.

According to another aspect of the present disclosure, a power supply device includes: the switching device (100) of any of the first to eleventh configurations described above; a control circuit (CNT) configured to control the states of the first to fourth transistors; the transformer (TR); and a secondary circuit (20) provided on the secondary side of the transformer. The control circuit controls the states of the first to fourth transistors to transmit electric power from the primary winding (W1) to the secondary winding (W2) of the transformer, thereby to generate in the secondary circuit an output voltage (Vo) based on the supply voltage. (A twelfth configuration.)

The invention claimed is:

1. A switching device comprising:

a reference terminal;

a supply terminal configured to be fed with a supply voltage with a potential higher than a potential at the reference terminal;

a first transistor configured to be inserted between the supply terminal and a first terminal of a primary winding of a transformer;

a second transistor configured to be inserted between the reference terminal and the first terminal of the primary winding;

a third transistor configured to be inserted between the supply terminal and a second terminal of the primary winding;

a fourth transistor configured to be inserted between the reference terminal and the second terminal of the primary winding;

a first diode configured to be connected in parallel with the first transistor;

a second diode configured to be connected in parallel with the second transistor;

a package housing the first to fourth transistors and the first and second diodes;

a plurality of external terminals exposed out of the package, the external terminals including the reference terminal and the supply terminal; and a supply lead frame, a reference lead frame, a first lead frame, a second lead frame, and a third lead frame, wherein the first and second diodes each have a forward direction thereof pointing from the reference terminal to the supply terminal, wherein each of the lead frames has an outer lead exposed out of the package and an inner lead located inside the package, the plurality of external terminals include, in addition to the reference terminal and the supply terminal, a first external terminal, a second external terminal, and a third external terminal, the third external terminal being configured to be connected to the first external terminal, the outer leads of the supply lead frame and the reference lead frame constitute the supply terminal and the reference terminal respectively, the outer leads of the first, second, and third lead frames constitute the first, second, and third external terminals respectively, the first transistor, the third transistor, and the first diode are disposed on the inner lead of the supply lead frame, the second transistor, the fourth transistor, and the second diode are disposed on the inner leads of the first, second, and third lead frames respectively, the first to third lead frames are disposed between the supply lead frame and the reference lead frame, the first and third lead frames are disposed adjacent to each other, and by wire bonding, the first transistor is made to conduct to the first lead frame, the first diode is made to conduct to the third lead frame, the third transistor is made to conduct to the second lead frame, and the second transistor, the fourth transistor, and the second diode are made to conduct to the reference lead frame.

2. The switching device according to claim 1, wherein on the inner lead of the supply lead frame, the first transistor and the first diode are located adjacent to each other, and the first and third lead frames are disposed adjacent to each other such that the second transistor and the second diode are located adjacent to each other.

3. The switching device according to claim 1, wherein the first to fourth transistors are each a MOSFET.

4. The switching device according to claim 3, wherein the first to fourth transistors are each a MOSFET formed using SiC.

5. The switching device according to claim 1, wherein the first and second diodes are each a Shottky barrier diode formed using SiC.

6. A power supply device comprising:

the switching device according to claim 1, a control circuit configured to control states of the first to fourth transistors;

the transformer, and a secondary circuit provided on a secondary side of the transformer, wherein the control circuit controls the states of the first to fourth transistors to transmit electric power from the primary winding of the transformer to a secondary winding thereof, thereby to generate in the secondary circuit an output voltage based on the supply voltage.

7. A switching device comprising:

a reference terminal;

a supply terminal configured to be fed with a supply voltage with a potential higher than a potential at the reference terminal;

a first transistor configured to be inserted between the supply terminal and a first terminal of a primary winding of a transformer;

a second transistor configured to be inserted between the reference terminal and the first terminal of the primary winding;

a third transistor configured to be inserted between the supply terminal and a second terminal of the primary winding;

a fourth transistor configured to be inserted between the reference terminal and the second terminal of the primary winding;

a first diode configured to be connected in parallel with the first transistor;

a second diode configured to be connected in parallel with the second transistor;

a package housing the first to fourth transistors and the first and second diodes;

a plurality of external terminals exposed out of the package, the external terminals including the reference terminal and the supply terminal; and a supply lead frame, a reference lead frame, a first lead frame, a second lead frame, and a third lead frame, wherein each of the lead frames has an outer lead exposed out of the package and an inner lead located inside the package, the plurality of external terminals include, in addition to the reference terminal and the supply terminal, a first external terminal and a second external terminal, the outer leads of the supply lead frame and the reference lead frame constitute the supply terminal and the reference terminal respectively, the outer leads of the first and second lead frames constitute the first and second external terminals respectively, the first transistor, the third transistor, and the first diode are disposed on the inner lead of the supply lead frame, the second transistor, the fourth transistor, and the second diode are disposed on the inner leads of the first, second, and the third lead frames respectively, the first to third lead frames are disposed between the supply lead frame and the reference lead frame, the first and third lead frames are disposed adjacent to each other, by wire bonding, the first transistor is made to conduct to the first lead frame, the third transistor is made to conduct to the second lead frame, and the second transistor, the fourth transistor, and the second diode are made to conduct to the reference lead frame, the first transistor and the first diode are connected in parallel with each other by use of the inner lead of the supply lead frame and a first wire that connects directly between the first transistor and the first diode inside the package, and the second transistor and the second diode are connected in parallel with each other by use of a second wire that connects directly between the inner lead of the first lead frame and the inner lead of the third lead frame inside the package and a third wire that connects directly between the second transistor and the second diode inside the package.

8. The switching device according to claim 7, wherein on the inner lead of the supply lead frame, the first transistor and the first diode are located adjacent to each other, and the first and third lead frames are disposed adjacent to each other such that the second transistor and the second diode are located adjacent to each other.

9. The switching device according to claim 7, wherein the first to fourth transistors are each a MOSFET.

10. The switching device according to claim 9, wherein the first to fourth transistors are each a MOSFET formed using SiC.

11. The switching device according to claim 7, wherein the first and second diodes are each a Shottky barrier diode formed using SiC.

12. A power supply device comprising:

the switching device according to claim 7;

a control circuit configured to control states of the first to fourth transistors;

the transformer, and a secondary circuit provided on a secondary side of the transformer, wherein the control circuit controls the states of the first to fourth transistors to transmit electric power from the primary winding of the transformer to a secondary winding thereof, thereby to generate in the secondary circuit an output voltage based on the supply voltage.

* * * * *